United States Patent [19]

Cass

[11] 3,999,214
[45] Dec. 21, 1976

[54] WIREABLE PLANAR INTEGRATED CIRCUIT CHIP STRUCTURE

[75] Inventor: Eugene E. Cass, Hopewell Junction, N.Y.

[73] Assignee: IBM Corporation, Armonk, N.Y.

[22] Filed: Jan. 6, 1976

[21] Appl. No.: 646,824

Related U.S. Application Data

[63] Continuation of Ser. No. 483,463, June 26, 1974, abandoned.

[52] U.S. Cl. .............................. 357/45; 357/68; 357/41; 357/48
[51] Int. Cl.² .................. H01L 27/10; H01L 27/02; H01L 27/04; H01L 23/48
[58] Field of Search .................. 357/41, 45, 48, 68

[56] References Cited

UNITED STATES PATENTS

| | | | |
|---|---|---|---|
| 3,760,384 | 9/1973 | Krolikowsky et al. | 357/41 |
| 3,808,475 | 4/1974 | Buelow et al. | 357/45 |

Primary Examiner—Edward J. Wojciechowicz
Attorney, Agent, or Firm—J. B. Kraft

[57] ABSTRACT

A planar semiconductor integrated circuit chip structure comprising a surface from which a plurality of regions of different conductivity types extend into the chip to provide the transistors and resistors wherein said transistors and resistors are arranged in a plurality of repetitive cells, each of said cells containing a sufficient number of transistors and resistors to form a selected type of logic circuit. The cells are arranged in an orthogonal array with the cells in substantially parallel rows in both orthogonal directions. The structure includes a level of metallization disposed above and insulated from the array by at least one layer of electrically insulative material. This level of metallization comprises a plurality of groups of substantially parallel lines respectively disposed above and running parallel to a corresponding plurality of interfaces between rows of said cells in one of the orthogonal directions. Each group of lines is connected to a plurality of cells abutting the interface below the group to provide interconnections between and voltage level supplies to said cells. In addition, this level of metallization includes a plurality of line patterns respectively disposed spaced from and between said groups and above the cells to provide intracell connections. With this arrangement, it is possible to have at one metallization level, the metallization lines required for the intracell connections and still provide channels spaced from the intracell connections wherein intercell metallization may be formed.

25 Claims, 25 Drawing Figures

WIREABLE PLANAR INTEGRATED CIRCUIT CHIP STRUCTURE

This is a continuation of application Ser. No. 483,463 filed June 26, 1974, now abandoned.

BACKGROUND OF INVENTION

The present invention relates to monolithic, large-scale integrated semiconductor circuit structures and particularly to such structures having arrays of logic circuit cells. The invention especially addresses novel layouts of the cell arrays in combination with layouts of the overlying metallization utilized to provide voltage level supplies to the cells, interconnect cells and intraconnect the semiconductor devices forming the particular circuit cell.

With the ever-increasing microminiaturization of integrated circuits and the attendant increased density of such circuits in large-scale integrated circuits, the arrangement of the metallization pattern utilized to intraconnect within cells, interconnect cells and provide the voltage supply distribution to the respective cells has been becoming increasingly difficult. It is regarded highly desirable within the art to utilize as few levels of metallization as possible separated by insulative layers. It is also considered to be very desirable to have the integrated circuit devices and metallizations laid out in such a fashion that design automation as well as computer-aided design of integrated circuits would be facilitated.

SUMMARY OF THE PRESENT INVENTION

Accordingly, the primary object of the present invention is to provide a planar integrated circuit structure suitable for large-scale integration wherein the number of required metallization levels is minimized.

It is another object of the present invention to provide a planar integrated circuit chip structure having a combination of device layouts and metallization pattern layouts such that the placement of the metallization "wiring" by design automation or computer-aided design is facilitated.

It is yet a further object of the present invention to provide a planar integrated circuit chip structure wherein the combination of device layout and metallization layout is such that open channels are provided for intercircuit connections and for voltage level distribution systems on the same metallization level wherein the basic intracircuit connections are made.

The present invention achieves the above objects through a novel combination of device layout and metallization layout. In the device layout, the devices are formed by a plurality of regions of different conductivity types extending into the chip to provide the transistors and resistors; these transistors and resistors are arranged into a plurality of repetitive cells. Each of the cells contains a sufficient number of transistors and resistors to form a selected type of logic circuit, and the cells are arranged in an orthogonal array with the cells in substantially parallel rows in both orthogonal directions.

In combination with this device layout, there is a level of metallization disposed above and insulated from the device array by at least one layer of electrically insulative material. This level of metallization has a layout wherein a plurality of groups of substantially parallel lines are respectively disposed above and run parallel to a corresponding plurality of interfaces between rows of said cells in one of said orthogonal directions. Each group of lines is connected to a plurality of cells abutting the interface below the group to provide interconnections between and voltage level supplies to said cells. The level of metallization further includes line patterns respectively disposed spaced from and between groups of lines, which line patterns are above said cells and provide the intracell connections.

In accordance with a further specific aspect of the present invention, the rows of cells may be spaced from each other at said interfaces to provide channels between the rows substantially free of transistors or resistors.

In the preferred embodiment of the present invention, each of a plurality of cells in each of the rows forming the interfaces in said one orthogonal direction has a first cell layout configuration at one side of the cell and a second layout configuration at its opposite side. The rows of cells in said one orthogonal direction are arranged alternatively so that sides of cells with the first configuration face the sides of cells in interfacing rows with said first configuration and sides of cells with said second configuration face sides of cells in interfacing rows with the second configuration.

With the arrangement described, it becomes very practical to arrange the rows of cells so that most, if not all, of the input-output nodes of the cells are arranged on one side of the cell. With such a structure, most of the connections to such cells may be made to the facing sides with the input-output nodes in interfacing rows of cells. Consequently, as a result of the alternative arrangement of the rows of cells, most of the input-output nodes in the respective cells will be disposed at every other row interface. With such an arrangement, the metallization pattern may correspondingly be arranged so that most of the parallel lines providing the interconnections between and voltage level supplies to the cells may be grouped whereby most of the lines are also above every other intersection. This will, of course, leave much more space on the metallization level between such alternative groups of lines. Such greater space may be more readily used for the intracell connections necessary to connect the transistors and resistors into the selected type of logic circuit.

This approach facilitates the use of a single level of metallization to provide both the necessary intracell connections as well as the intercell connections and voltage level distribution in one of the orthogonal directions.

BRIEF DESCRIPTION OF THE PREFERRED EMBODIMENTS

The specific embodiments of the present invention will now be described. Since the present invention resides primarily in the structural layout of a large-scale integrated circuit in combination with its metallization layout rather than in any specific fabrication techniques for forming integrated circuits or insulated metallization patterns, the techniques for forming integrated circuits and the various metallization levels will not be described in any extensive detail. Unless otherwise stated, it may be assumed that any of the conventional photolithographic fabrication techniques utilizing either diffusion or ion implantation may be used in the formation of the devices in the integrated circuit, and that any of the standard techniques for forming insulative layers of metallization, including multi-layer metallization, may be utilized in forming the metallization layouts. For example, the integrated circuit chip may be fabricated utilizing the techniques described in either U.S. Pat. Nos. 3,539,876 or 3,656,028 among others. Likewise, the techniques set forth in U.S. Pat. Nos. 3,558,992 and 3,725,743, as well as 3,539,876 among others may be utilized in forming the various metallization levels, the insulative layers separating the metallization levels and the via holes or openings in the insulative layers through which the various levels of metallization are interconnected.

Figure 1:
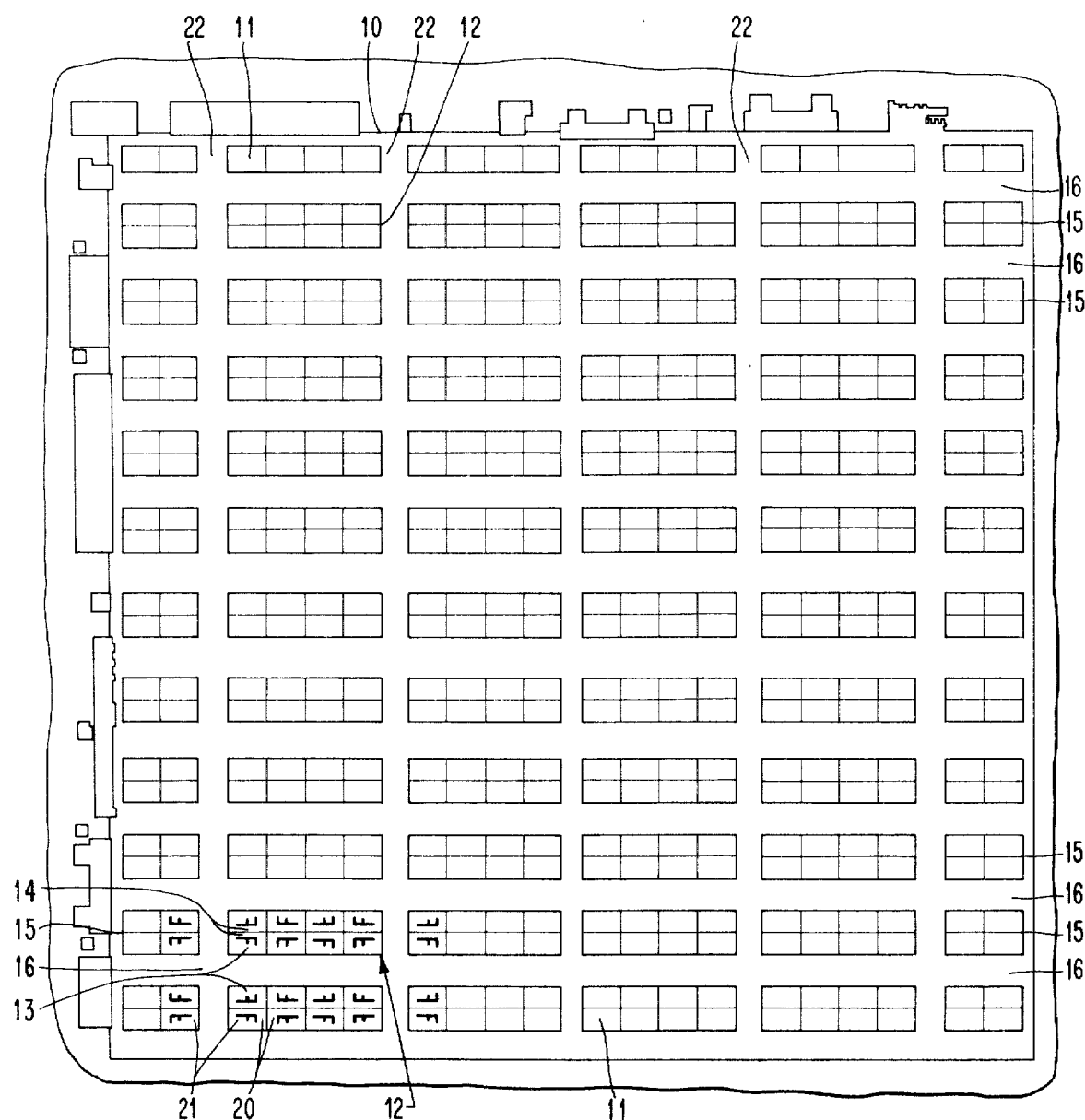
FIG. 1 is a diagrammatic plan view of the semiconductor substrate without metallization simplified in order to show the arrangement of repetitive circuit cells in accordance with one embodiment of the present invention.
Figure 3:
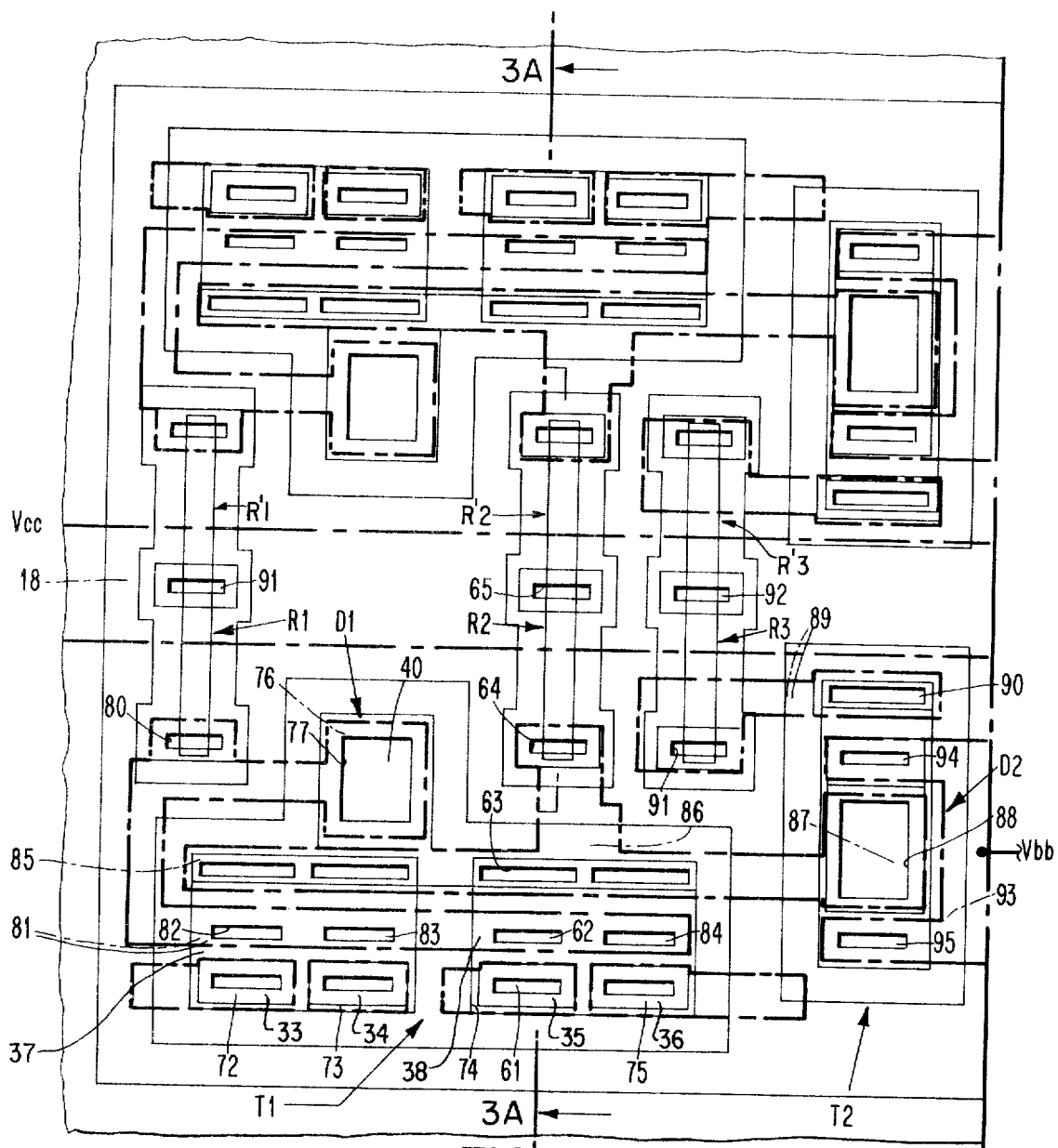
FIG. 3 is a plan view of a pair of cells in the block of FIG. 2 which illustrates in even greater detail the layout of the transistors and resistors in the cell as well as the metallization in the first level above the cell.
Figure 9:
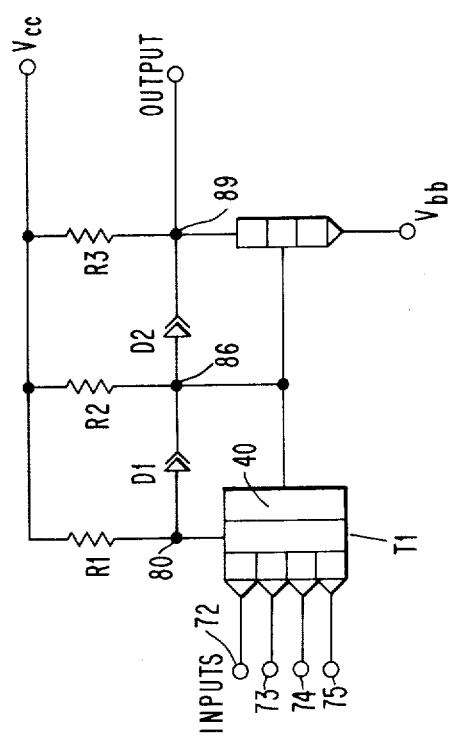
FIG. 9 is a schematic circuit diagram of the selected type of logic circuit formed in each of the cells of the integrated circuit array of FIG. 1.

With reference to FIG. 1, a diagrammatic plan view is shown of the layout of the circuit cells in a large-scale integrated circuit chip 10. Each of the cells 11 is arrayed in a row in the X orthogonal direction and in a row in the Y orthogonal direction. Each cell 11 contains a sufficient number of transistors and resistors which, when intraconnected by the intracell metallization to be hereinafter described, will form a selected type of logic circuit. In the present embodiment, the selected logic circuit, a schematic of which is shown in FIG. 9, is a T$^2$L Schottky barrier diode clamped circuit. The circuit, as well as the transistor and resistor regions forming each cell, will hereinafter be described in greater detail with respect to FIGS. 3 and 9. FIG. 3 is an enlarged plan detailed view showing a pair of abutting or facing circuit cells.

Figure 2:
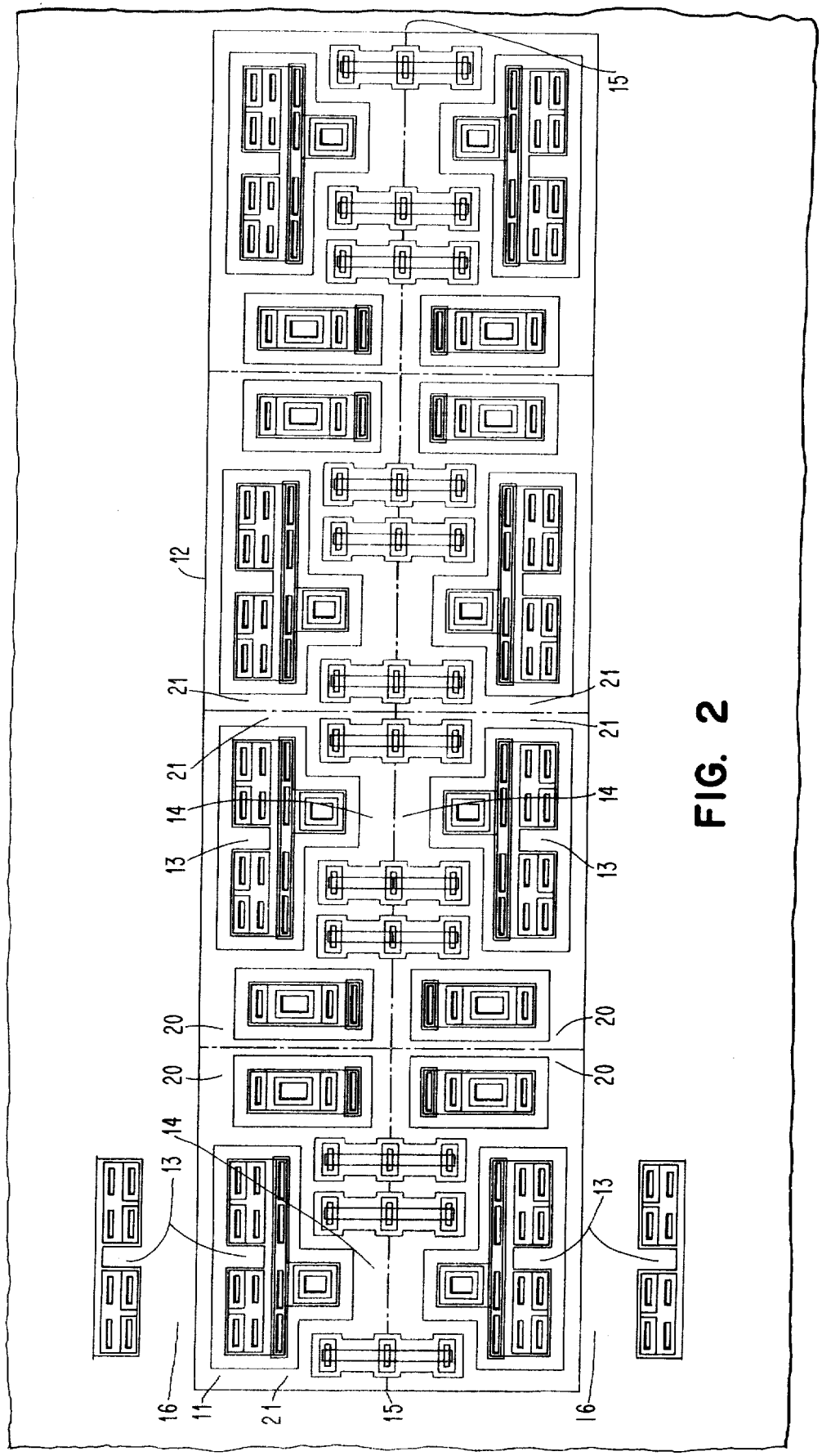
FIG. 2 is a detailed plan view of one block of cells of the structure of FIG. 1, again without any metallization, to illustrate the regions in the substrate which form the transistors and resistors in the circuit.

In the array of FIG. 1, the cells are arranged in blocks 12, two cells wide in the Y direction and four cells wide in the X direction. The layouts of the devices and regions forming the devices for the typical block of cells 12 is shown in FIG. 2 in detail. Thus, FIG. 3 represents an even more detailed view of one pair of cells in block 12 of FIG. 2.

With respect to FIGS. 1 and 2, it should be noted that in the array, each of cells 11 does not have a symmetrical layout; it has a first layout configuration 13 on one side of the cell and a second layout configuration 14 on the opposite side of the cell. The rows in the X direction shown are arranged so that layout configurations 14 face each other at abutting row interfaces 15 and the layout configurations 13 face each other along row interfaces 16 which are channeled running in the X direction.

For diagrammatic purposes, the variation in layout configuration in each cell is shown in FIG. 1 by the symbol ⊔ drawn within several of the cells. Accordingly, each cell has a first layout configuration at one side of the cell 13 represented by the two bars of ⊔ and a second layout configuration 14 at the opposite side of the cell represented by the horizontal single bar in ⊔. By this arrangement of cells so that sides 13 face each other and sides 14 face each other, the metallization for distributing voltage levels and for intraconnecting individual cells and interconnecting groups of cells is greatly facilitated. As a result, a single level of metallization, which in the present case is the first level of metallization, may be arranged so as to provide for substantially all of the horizontal lines which provide the interconnection between cells in the X direction as well as providing the $V_{cc}$ voltage level supplies to the cells in the X direction and, in addition, still have sufficient remaining space on the metallization level to provide for substantially all of the intraconnections in each cell.

Figure 2A:
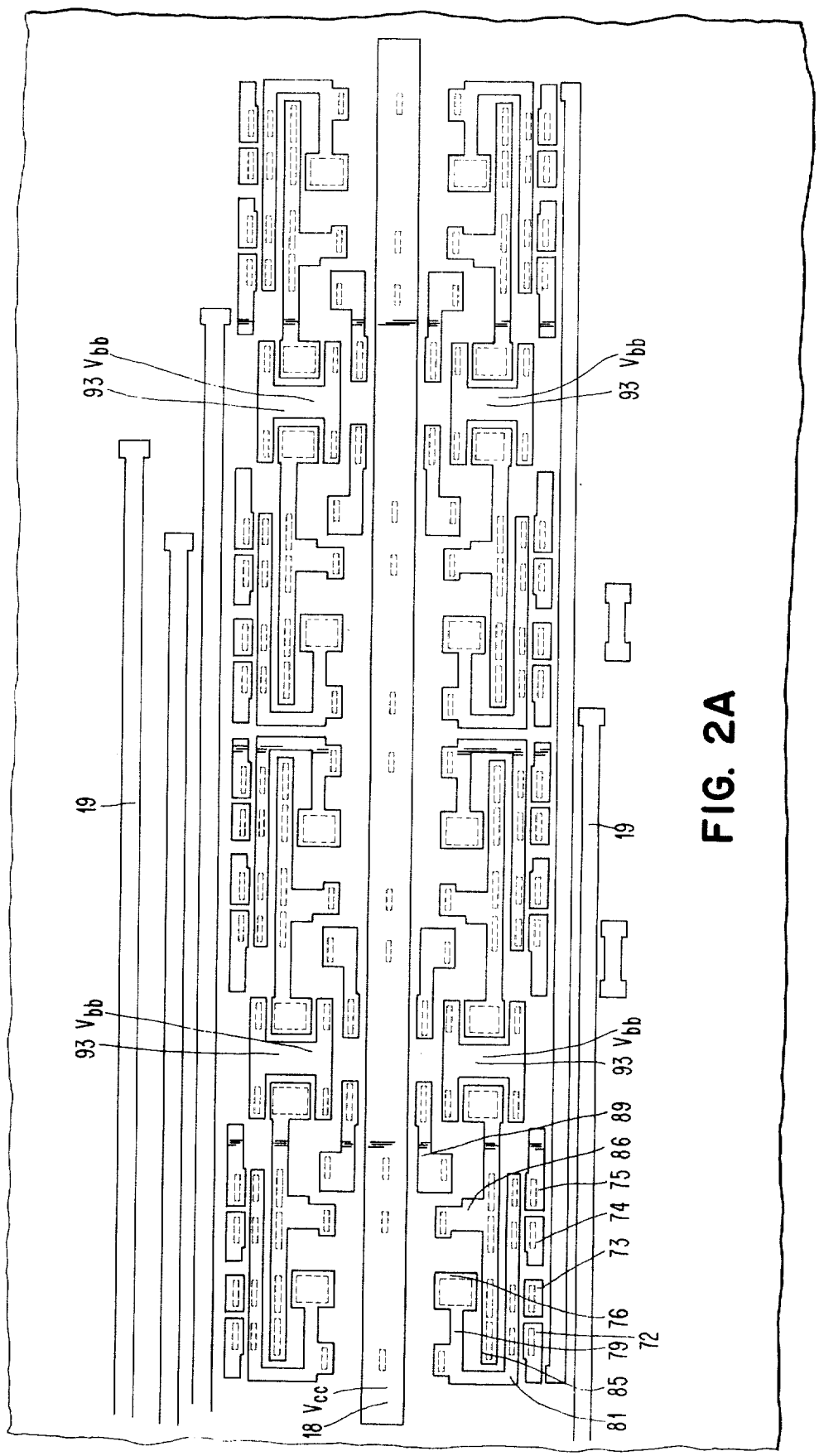
FIG. 2A is a plan view of a portion of a first metallization level which is disposed above the block of FIG. 2 to provide primarily intracell connections as well as a voltage distribution bus bar running along the interface of paired cells in the block.
Figure 4A:
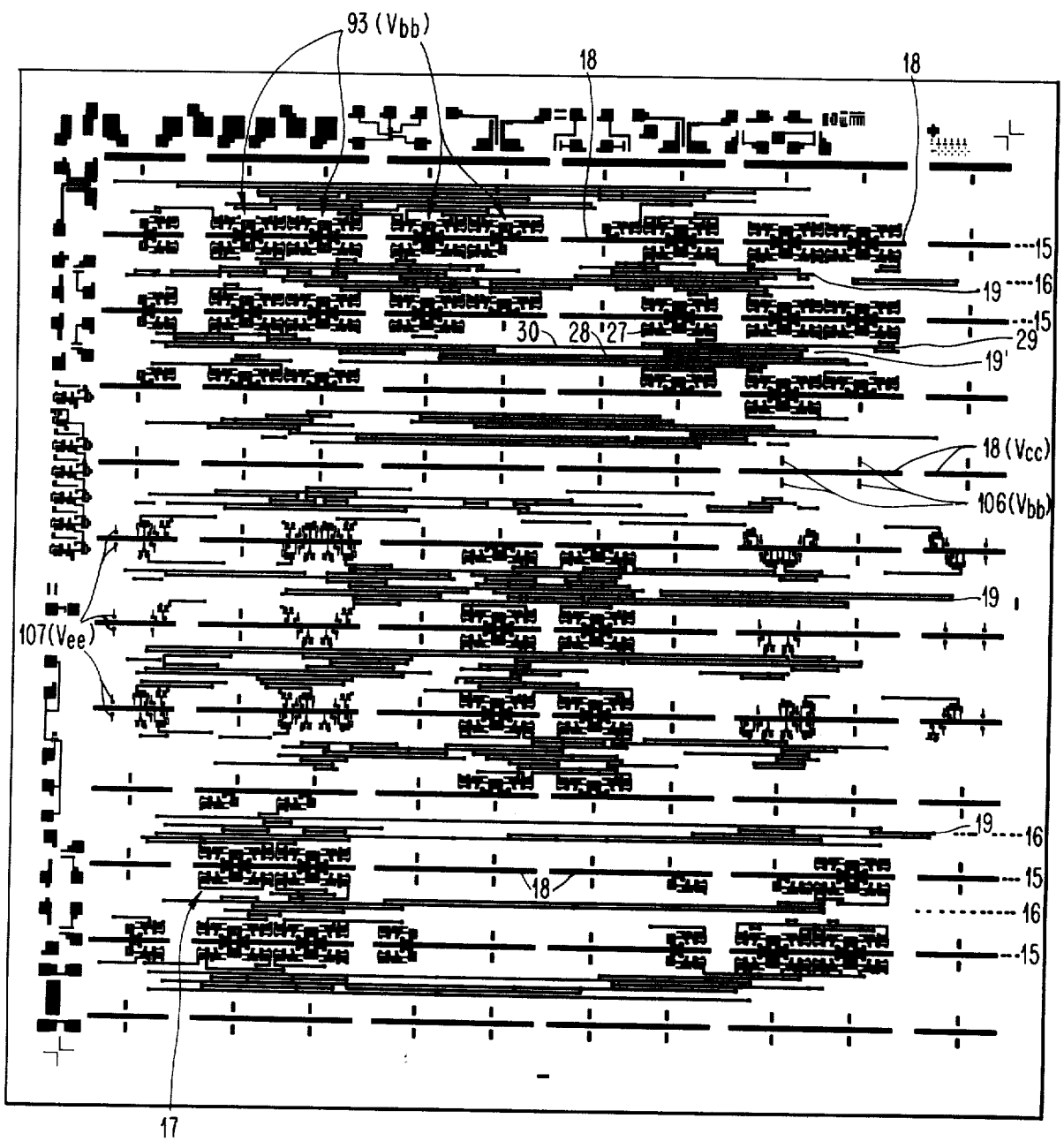
FIG. 4A is the mask providing the first level of metallization for the chip structure of FIG. 1 (The metallization shown in FIG. 2A is an enlargement of a sector in the metallization of FIG. 4A.).

The layout of this first metallization level will be more clearly understood with reference to FIG. 4A which is the mask for producing the first level metallization pattern. Thus, all of the dark areas in the layout of FIG. 4A represent metallization. The metallization in FIG. 4A corresponds to the layout of the chip of FIG. 1A. Thus, the metallization layout of FIG. 4A should be considered as superimposed and brought into registration with the circuit cell array of FIG. 1. As an aid to this, horizontal interfaces 15 and 16 are shown in FIG. 4A in phantom lines. The horizontal metallization for providing the voltage level distribution and interconnections between cells are represented by relatively long lines in FIG. 4A running in the X direction while the metallization providing for the intracell connection is shown in clusters. For example, cluster 17 represents the intracell metallization for a single cell. A more detailed view of intracell metallization may be had with reference to FIG. 2A which represents that portion of the first level metallization pattern of FIG. 4A which is superimposed upon cell block 12 of FIG. 2. In FIG. 2A, the metallization pattern for providing intracell connections for a single cell is encircled and designated 17.

Considering again FIGS. 1 and 4A, the horizontal lines of metallization are arranged in sets or groups so as to run above interfaces 15 and 16 between the rows of cells in the horizontal direction. In the case of interfaces 15 wherein the adjoining cells abut each other, the sets running above the interface each comprise a single horizontal bus bar 18 which is utilized for $V_{cc}$ voltage distribution to the cells in rows along the interface. On the other hand, at interfaces 16 where the adjoining or facing cells are spaced from each other, the wiring channels at the first metallization level shown in FIG. 4A are wider and the sets 19 may contain up to eight parallel lines running in the X direction above intersections 16. Sets 19 are utilized to provide substantially all of the interconnections between cells in rows in the X direction.

It, thus, may be seen that by grouping the horizontally running lines above the interfaces of the rows of cells running in the X direction, and by arranging the cells so that each alternate row has the opposite ⊔ orientation so that the sides of the cells facing each other are the mirror images of each other, sufficient space exists between sets of lines to accommodate all the metallization necessary for even complex cell intraconnection on the same metallization level.

It also should be noted that the structural layout gives the integrated circuit designer a great deal of flexibility in forming this layer of metallization. Because of this mirror image arrangement of the cells, the cells may be oriented so that cell sides with most of the input-output nodes face only alternate interfaces while the other interfaces have abutting cell sides with relatively few or even no input-output nodes. In the arrangement shown in FIG. 4A, for example, the cells are arranged so that the cell sides to which most of the input-output connections are to be made face interface 16 while the cell sides to which relatively few input-output connections are to be made face interface 15. By providing a space between circuit cells at alternate interfaces 16, the dense horizontal wiring 19 may be grouped above spaced interface 16 and, thus, avoid any problem of overlap with the metallization clusters 17 providing the intracell wiring. The metallization arrangement described may be seen in greater detail in FIG. 2A.

While the present embodiment is shown with such spaced interfaces 16 to accommodate dense wiring groups 19, it should be understood that other embodiments of the present invention require no spacing between cells; the embodiment of FIG. 6 which has no spaced intersections, and wherein all cells abut each other will be described in detail later in the specification.

In addition to providing for sufficient space for intracell connections on the same metallization level with the horizontal intercell connections, the structure of the present invention facilitates the designing of the metallization patterns by known fully automated design automation techniques or computer-aided design techniques. Such techniques require channels on the metallization level for intercell connections and voltage distribution, which channels are free of other metallizations such as intracell connections. In addition, such techniques require metallization channels which are selectively adjustable so as to accommodate a selected number of parallel lines within each channel. The present invention provides such a structure.

While we have discussed the various advantages of the cell arrangement in one orthogonal direction, similar additional advantages may be obtained by also orienting the cells in the manner described in the rows running in the other (Y) orthogonal direction. With reference to FIGS. 1 and 2, each of the cells in the rows in the Y direction has one layout configuration 20 on one side of the cell and an opposite layout configuration 21 on the opposite side of the cell. The rows in the Y direction are arranged with the cells in alternative orientation so that sides of cells having configuration 21 face each other and sides of cells having configuration 20 face each other at alternate row interfaces. This is illustrated again by the direction of the ⊔ in FIG. 1.

As seen from FIG. 1, the rows are arranged in the Y direction so that at every fifth interface, the vertical or X rows are spaced from each other by a channel 22. While the cell arrangement of the embodiments of FIGS. 1 and 6 have abutting rows of cells, the cells could be arranged so that every interface in both the X and Y directions would be a spaced channel. In such a cell, each of blocks 21 would contain a sufficient number of resistors and transistors to form one circuit of a selected type.

Figure 4B:
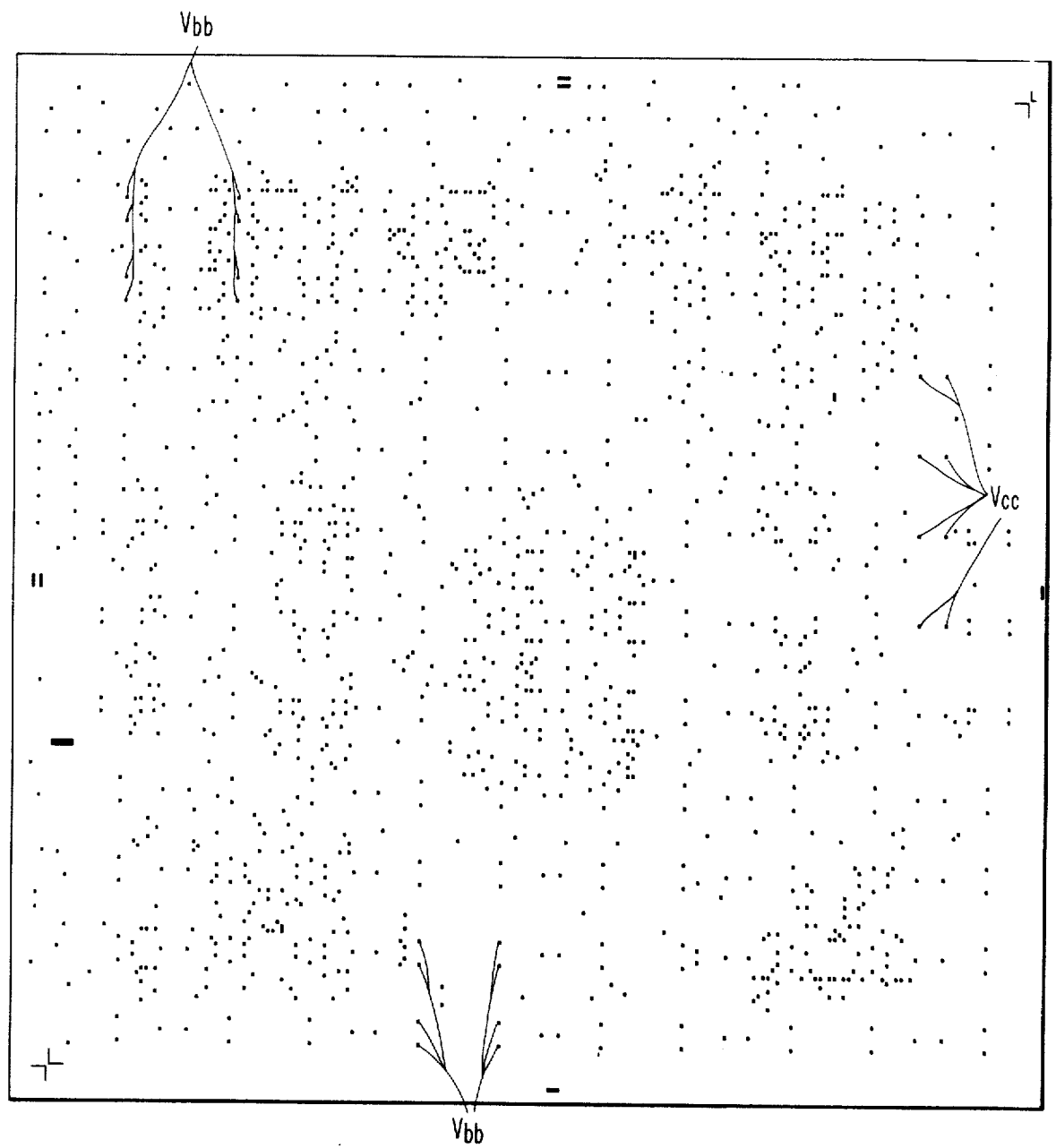
FIG. 4B is a plan view of the mask for forming the via holes through an insulative layer through which via holes will interconnect the first level of metallization formed by the pattern of FIG. 4A to the second level of metallization shown in FIG. 4C.
Figure 4C:
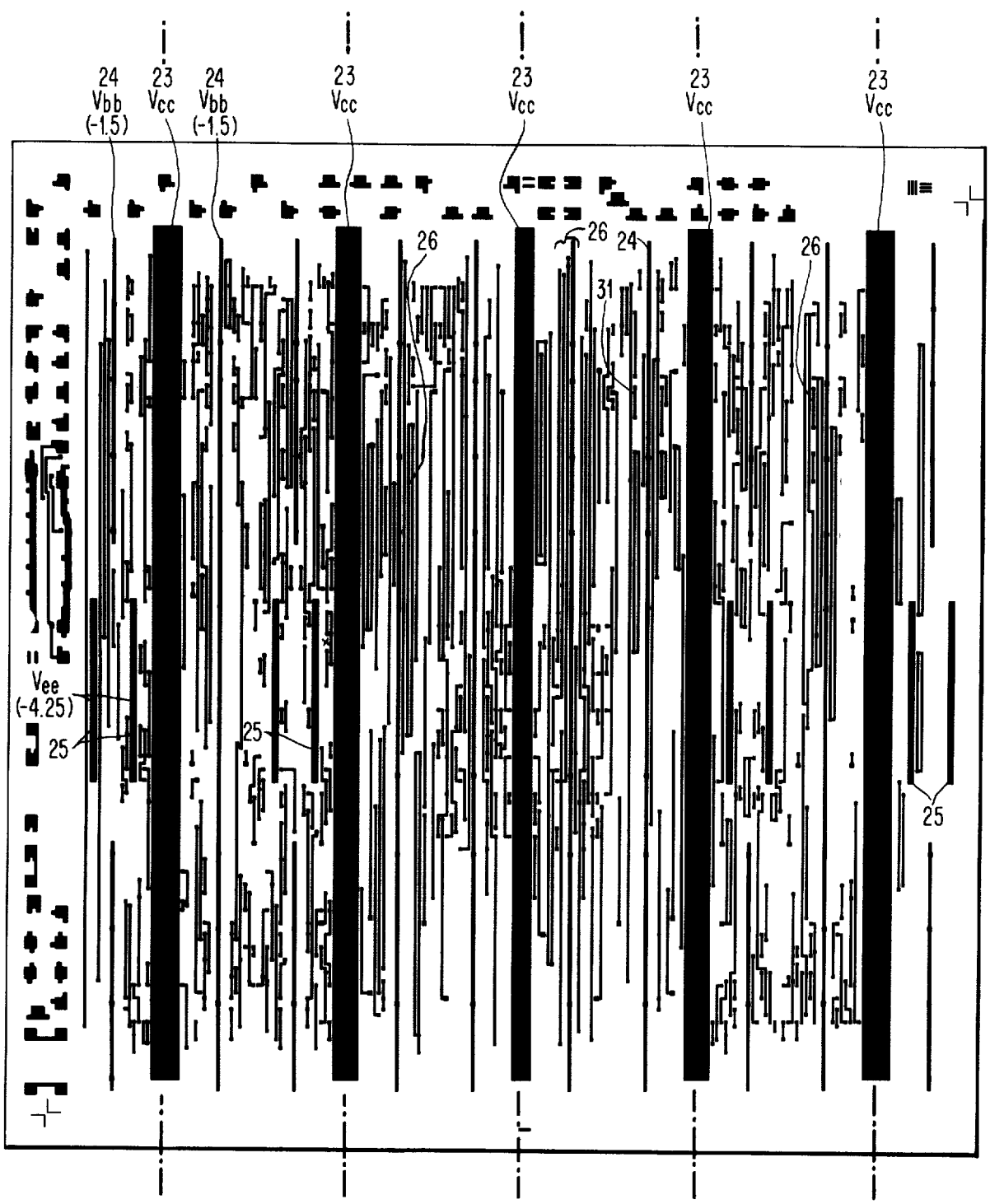
FIG. 4C is a plan view of the mask for the second level of metallization.

Again, with respect to the embodiment of FIG. 1 having a first level of metallization as shown in FIG. 4A, the structure has a second level of metallization having a pattern corresponding to the second level metallization mask shown in FIG. 4C; the dark areas represent the metallization lines. The second level metallization pattern is selectively connected to the first level metallization pattern of FIG. 4A through a plurality of via holes shown in the mask of FIG. 4B.

At this point, it should be noted that the metallization layers as well as the insulative layers separating said metallization layers and the via holes through the separating insulative layers are formed in accordance with conventional multilevel metallization technology described in U.S. Pat. Nos. 3,558,992, 3,725,743 or 3,539,876. The insulative layers may be formed of any of the conventional materials used for insulative layers such as silicon dioxide or silicon nitride, and the metallization may be any conventional thin film metallization used in integrated circuits such as aluminum, chromium, palladium or copper-doped aluminum.

Again, with respect to the second level metallization of FIG. 4C, voltage distribution bus bars $V_{cc}$ 23 override spaced interfaces 22. In addition, the metallization running between bus bars 23 includes bus bars 24 for the vertical distribution of the $V_{bb}$ voltage level supply and bus bars 25 for the vertical distribution of the $V_{33}$ voltage supply. In addition, the pattern includes a plurality of parallel interconnection lines 26 running in the Y direction for providing the interconnection between rows of circuit cells in the Y direction. Besides performing the interconnections in the Y direction, lines 26 perform the additional function of providing crossovers over one or more lines in a given set 19 in the first metallization level shown in FIG. 4A. For example, with reference to FIGS. 4A and 4C, if cell 27 were to be connected to line 28 in set 19', lines 29 and 30 would have to be crossed. In such a case, the second level metallization running in the Y direction would have to be utilized to connect from circuit 27 to line 28 in order to cross over lines 29 and 30. This would be accomplished merely by running a via hole from the appropriate node in the metallization of circuit 27 through the intermediate insulative layer to a line running in the Y direction in FIG. 4C, for example, segment 31, FIG. 4C, which would cross lines 29 and 30 terminating in a via hole extending back through the insulative layer to line 28 in the first level of metallization.

Before going into details with respect to the voltage distribution system involving the first and second levels of metallization as well as in voltage terminal level of metallization shown in FIG. 4E, some additional details with respect to the layout of transistors and resistors in the basic cells 11 of FIG. 1A as well as the fabrication of such structures will now be given. With reference to FIG. 3, which shows a detailed view of a pair of cells sharing common resistors, each of the cells comprises two transistors, T1 and T2, and three resistors, R1, R2 and R3. Resistors R1, R2 and R3 are respectively the lower halves of common resistance regions shared with the other cell in the pair which are designated as R'1, R'2 and R'3. Transistor T1 is a four-emitter transistor with N+ regions 33, 34, 35 and 36 serving as emitters. Transistor T1 further includes a pair of P type base regions 37 and 38 which are shorted together by metallization 81 to provide a common base for the transistor T1. In addition, transistors have a common N type collector region 40 all formed over an N+ subcollector 41.

Transistor T2 comprises P type base region 42, N type collector region 43, N+ emitter region 44, all formed over N+ subcollector region 45.

The metallization shown as well as the contact openings to this metallization will be described in greater detail later in the specification.

Figure 3A:
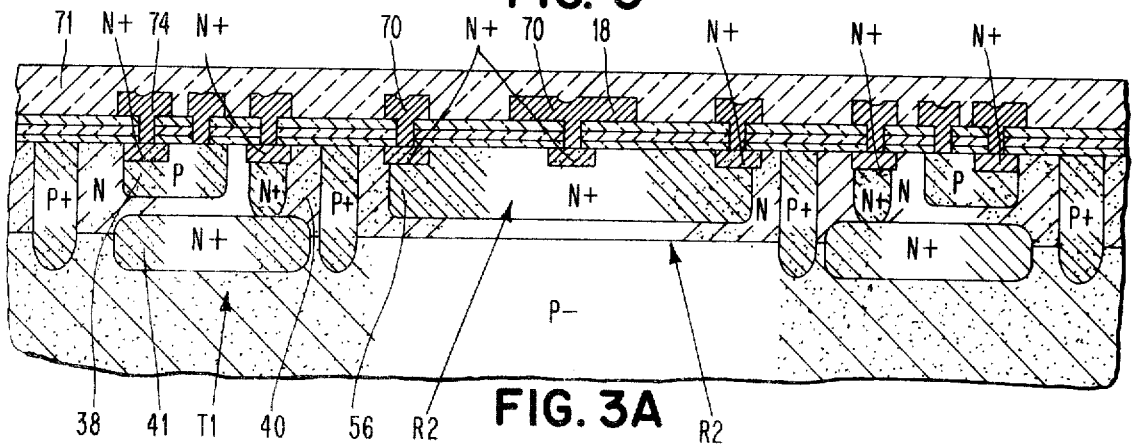
FIG. 3A is a diagrammatic cross-sectional view taken along line 3A—3A of FIG. 3.

A cross-section of the structure along line 3A—3A of FIG. 3 is shown in FIG. 3A. With reference, now, to FIGS. 5A–5I, there will now be described the method for fabricating the structure shown in FIG. 3A. For purposes of simplicity, only the left-hand half of the structure of FIG. 3A is shown in the fabrication process of FIGS. 5A–5I. In describing the fabrication techniques utilized, only brief details will be given as the techniques are conventional. For a more detailed description of any particular step, reference should be made to U.S. Pat. No. 3,539,876 or 3,656,028.

Figure 5A:
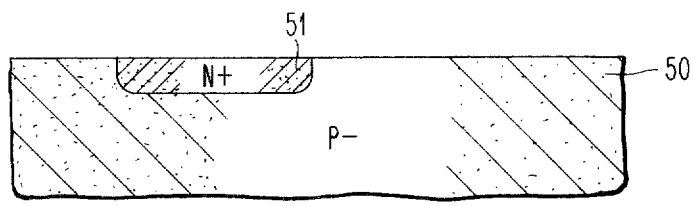
FIGS. 5A–5I are diagrammatic cross-sectional views of a portion of the cross-section of FIG. 3A at various fabrication stages for purposes of illustrating a method for fabricating a chip in accordance with the present invention.
Figure 5B:
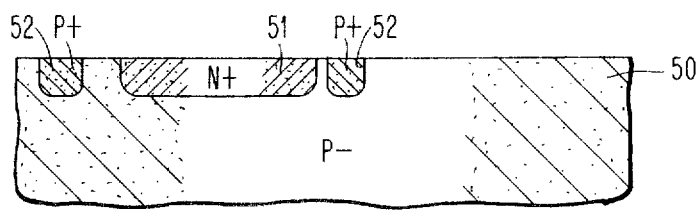

With reference to FIG. 5A, in a suitable wafer 50 of P− material, i.e., a silicon substrate having a resistivity of 10 ohm/cm, N+ region 51 which will function as a subcollector is formed utilizing conventional photolithographic masking techniques and diffusion or ion implantation with an impurity such as phosphorus as described in U.S. Pat. No. 3,539,876. The N+ region has a $C_0$ of about $10^{21}$ atoms/cm$^3$. Then, by similar techniques, a P+ region 52 which is to serve as part of the isolation region is formed, FIG. 5B. The conductivity-determining impurity in region 12 is preferably boron having a $C_0$ of $5 \times 10^{19}$ atoms/cm$^3$.

Figure 5C:
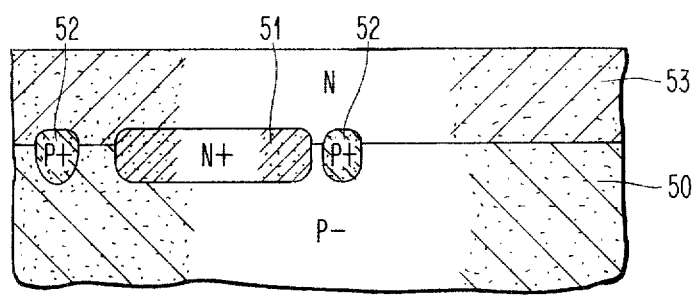
Figure 5D:
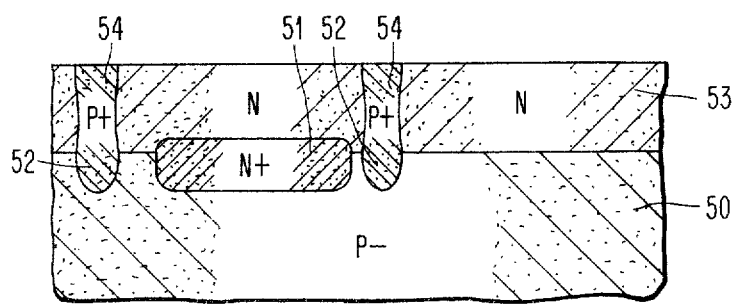
Figure 5E:
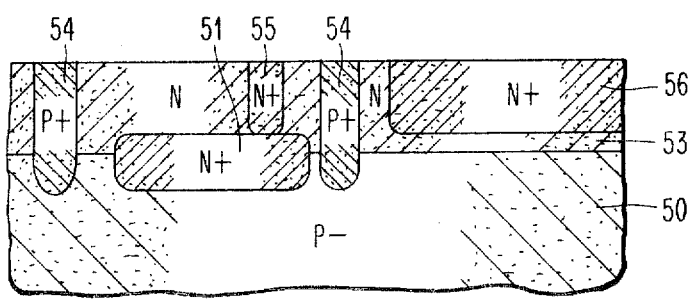
Figure 5F:
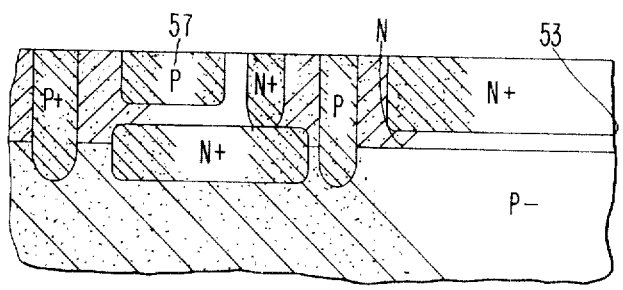

With reference to FIG. 5C, there is then formed on substrate 50, an N epitaxial layer 53 having a maximum impurity concentration or doping level of $10^{18}$ atoms/cm$^3$. This layer is formed by conventional epitaxial deposition techniques at a temperature in the order of from 950° to 1150° C over a period of about 17 minutes. During the deposition of epitaxial layer 53, regions 51 and 52 outdiffuse partly into the epitaxial layer. The epitaxial layer has a thickness of about two microns. The layer may be formed using the apparatus and method described in U.S. Pat. No. 3,424,629. Then, FIG. 5D, again utilizing the same techniques as used for the formation of regions 52, P+ regions 54 having the same constituents and concentrations as regions 52 are formed at the surface of epitaxial layer 53. During the formation of regions 54, regions 52 outdiffuse up into contact with regions 54 so that regions 52 and 54 are continuous to provide a P+ isolation region extending from the surface of epitaxial layer 53 down into substrate 50.

Next, FIG. 5E, again using conventional photolithographic fabrication techniques, N+ regions 55 and 56 are formed simultaneously utilizing a phosphorous dopant to a $C_0$ of $10^{21}$ atoms/cm$^3$. Region 55 provides the reach-through contact from the surface of epitaxial layer 53 to subcollector 51 while region 56 will provide the resistors, e.g., R2. Then, FIG. 5F, again using the conventional photolithographic masking end fabrication techniques as described in U.S. Pat. No. 3,539,876, for example, P type base region 57 is formed with a boron dopant. Region 57 has a $C_0$ of $5 \times 10^{19}$ atoms/cm$^3$.

Figure 5G:
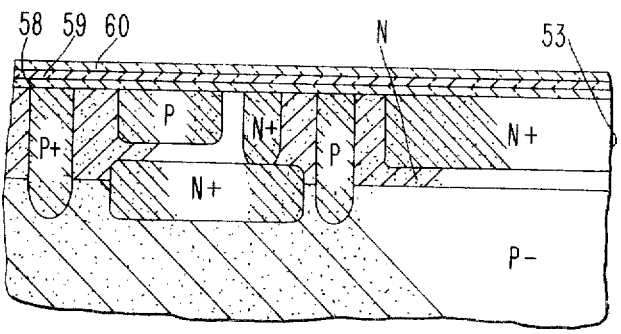

At this stage, FIG. 5G, a three-layer composite passivation and masking structure is formed over epitaxial layer 53. The structure comprises a bottom layer 58 of silicon dioxide formed by conventional thermal oxidation techniques and having a thickness of 1500A, an intermediate layer 59 of silicon nitride formed by conventional chemical vapor deposition techniques and having a thickness of 8000A and a top layer 60 of silicon dioxide deposited by standard chemical vapor deposition methods, and having a thickness of 500A to 1000A.

Figure 5H:
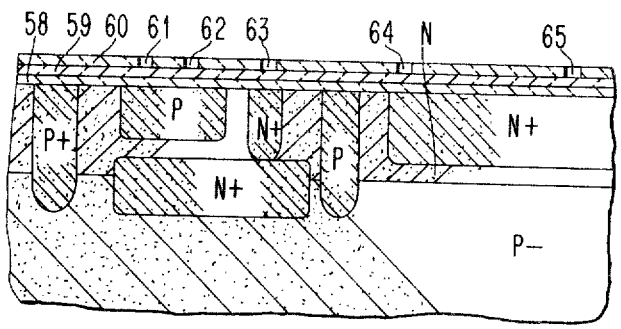

Then, FIG. 5H, openings are made only in layer 60 to coincide with all contact openings which are to be made through the passivation composite to the various regions in epitaxial layer 53. These openings include emitter contact 61, base contact 62, collector contact 63 and resistor contacts 64 and 65. The openings through silicon dioxide layer 60 are made by conventional photolithographic masking and etching techniques with a conventional etchant for silicon dioxide such as hydrofluoric acid. In etching these openings, silicon nitride layer 59, which is relatively resistant to hydrofluoric acid, is not etched and acts as a blocking layer.

Figure 5I:
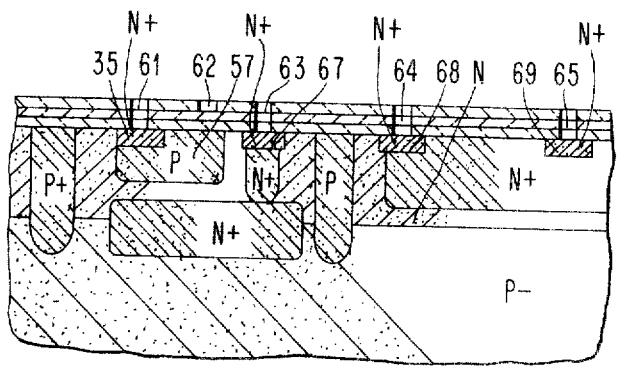

Then, utilizing appropriate photolithographic etching and masking techniques, openings 61, 63, 64 and 65 are etched so as to extend through layers 58 and 59 to the surface of epitaxial layer 53 as shown in FIG. 5I. Only base contact opening 62 remains blocked by layers 58 and 59. The etching of these openings is accomplished utilizing first a suitable etchant for silicon nitride layer 59, such as hot phosphoric acid, to expose layer 58 in the openings, after which the openings are etched through layer 58 using, again, a conventional etchant for silicon dioxide such as hydrofluoric acid. Next, utilizing conventional diffusion techniques, N+ emitter region 35, N+ collector contact region 67 and N+ resistor contact regions 68 and 69 are formed through the introduction of an impurity, such as arsenic, respectively through openings 61, 63, 64 and 65. These N+ regions, which are formed simultaneously, have a $C_0$ of $10^{21}$ atoms/cm$^3$. After the introduction of these N+ regions, base contact opening 62 is etched through layers 58 and 59 so as to extend into contact with base region 57. At this point, all contact openings to the substrate are open.

Then, the first level metallization is applied over the structure of FIG. 5I and the first level metallization pattern shown in FIG. 4A is formed over the entire structure by conventional photolithographic etching techniques such as those described in U.S. Pat. No. 3,539,876. For the structure of FIG. 5I, with this first level of metallization, reference should again be made to FIG. 3A which shows the metallization pattern 70 deposited in the various contact openings. Metallization pattern 70 may be conveniently formed of aluminum or copper-doped aluminum, i.e., an aluminum alloy containing less than 5% copper. A layer of insulative material 71 is deposited over the first level of metallization 70. Layer 71 may conveniently be chemical vapor deposited silicon dioxide. In making the appropriate connections from the first layer of metallization 70 to the second level of metallization shown in FIG. 4C, via holes may be made through insulative layer 71 utilizing any of the conventional techniques previously described.

The basic unit cells shown in cross-section in FIG. 3A and in plan view with the first level metallization applied in FIG. 3 has a circuit structure shown in FIG. 9. The circuit in FIG. 9 is a T$^2$L circuit with a multiple (four) emitter transistor T1 coupled to a single emitter transistor T2. In each of the transistors, the bases are respectively clamped to the collector by Schottky barrier diodes D1 and D2. Resistors R1, R2 and R3 correspond to the resistors similarly designated in the circuit of FIG. 3. Input terminals 72, 73, 74 and 75 to the emitters of transistor T1 are represented by metallization segments 72, 73, 74 and 75 in FIG. 3. Diode D1 is formed by metallization pad 76 which, through contact opening 77, shorts P base region extension 38', which is continuous with P type base region 38, to collector region 40. Diode D1 is connected to resistor R1 by metallization segment 79 through contact opening 80. Metallization segment 81 shorts the P type base region of transistor T1 together at all points through contacts 82, 83, 62 and 84 to the various sectors of the P type base region. Metallization segment 85 shorts the collector region of transistor T1 together in a similar fashion. Metallization segment 85 is continuous with segment 86 which is connected to resistor R2 through contact 64. Base region 42 of transistor T2 is connected to transistor T1 through metallization segment 87 through base contact 88 which shorts the base collector junction to provide diode D2. The collector of transistor T2 is connected to resistor R3 through metallization segment 89 which communicates with the collector of T2 through collector contact opening 90 and to resistor R3 through contact opening 91. The output of the circuit is also taken from metallization segment 89. With respect to voltage supplies to the cell, $V_{cc}$ supply to resistors R1, R2 and R3 is provided by bus bar 18 on the first level of metallization which communicates with R1, R2 and R3 respectively through contacts 91, 65 and 92. The $V_{bb}$ supply to transistor T2 is provided by metallization segment 93 which communicates with transistor T2 through emitter contact openings 94 and 95.

As will be noted from FIG. 3, the other cell in the pair is the mirror image of the cell circuit just described with respect to interface 15 above which $V_{cc}$ bus 18 lies. For purposes of orientation, the transistors and resistors in the mirror image cell of the pair have been designated as R'1, R'2, R'3, T'1 and T'2. It should be noted that the effective portions of the resistors, e.g., N+ region 56, are continuous between the R and the R' resistors with the center tap to the resistor provided from $V_{cc}$ bus bar 18 through a center contact, e.g., contact 65, serving to separate the resistors into the R and R' halves.

The voltage distribution system throughout the chip will now be described with respect to FIGS. 4A, 4C and 4B which are respectively the first level of metallization, the second level of metallization and the via holes joining the first and second metallization plus FIG. 4E which is the top or voltage distribution level of metallization and FIG. 4D which is the via hole pattern linking the top level of metallization from the second level of metallization. With respect to FIG. 4E, which represents the top level of metallization, there are five metal buses: buses 101 and 102 are utilized for $V_{cc}$ distribution and are connected through a layer of insulative material (not shown) over the top level of metallization to a pair of $V_{cc}$ chip terminal pads, shown in phantom lines, which are on the surface of the covering insulative layer; buses 103 and 104 for $V_{bb}$ voltage level distribution (minus 1.5 volts) which likewise are joined to pads, shown in phantom, on the surface of the covering layer of insulation; and $V_{ee}$ bus bar 105 (minus 4.5 volts) which likewise is joined to a pair of pads, shown in phantom, on the covering layer of insulative material. In addition, the covering layer of insulation contains an internal circular array of centrally located additional pads, shown in phantom, which serve the various input-output interconnections of any particular chip with other integrated circuit chips.

Figure 4D:
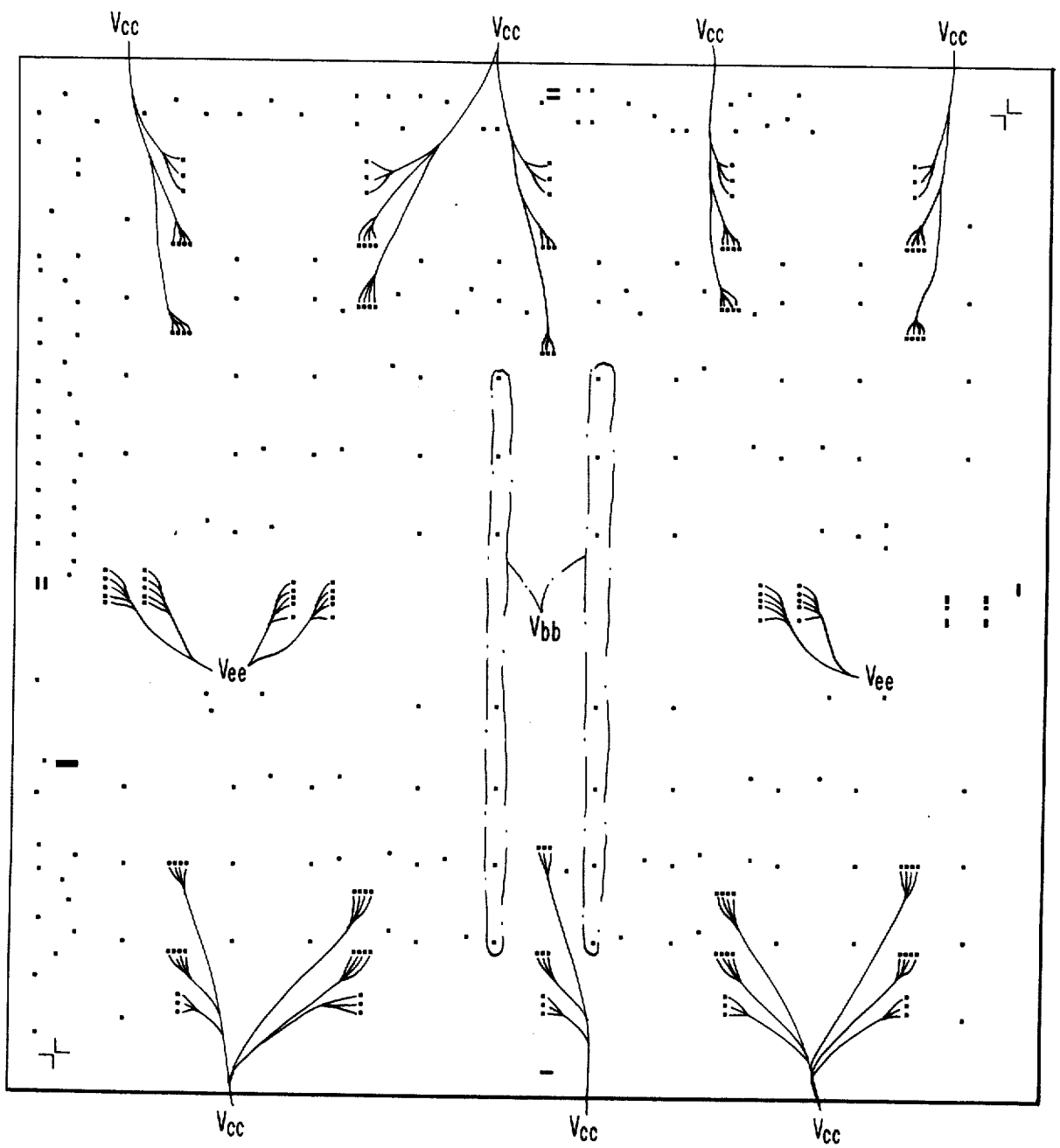
FIG. 4D is a plan view of the mask for forming the via holes which will interconnect the second level of metallization pattern of FIG. 4C with a top level metallization pattern of FIG. 4E.
Figure 4E:
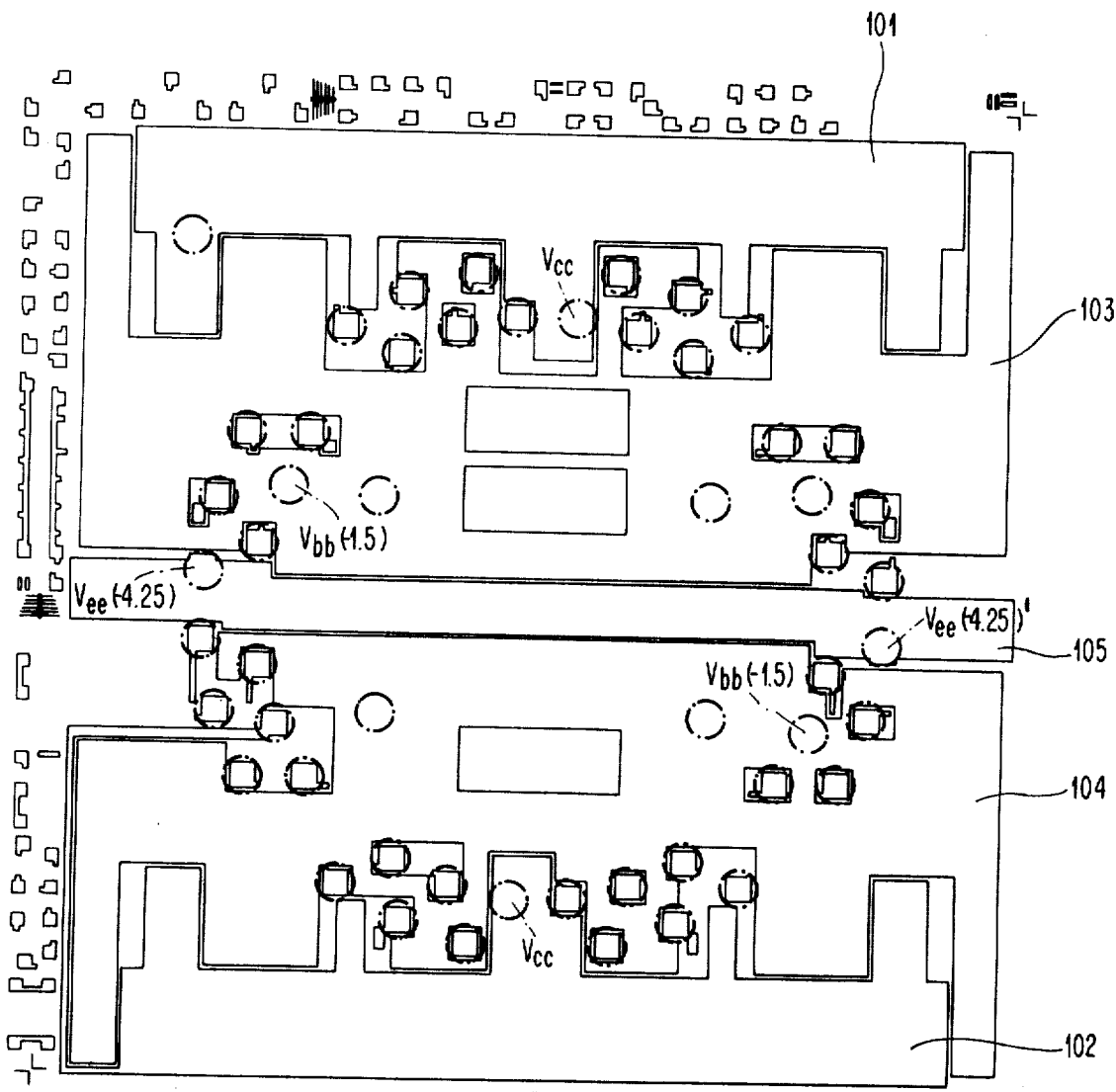
FIG. 4E is a plan view of the top level metallization pattern.

In order for the voltage distribution bus arrangement, shown in FIG. 4E, to communicate with the second level of metallization, shown in FIG. 4C, variously disposed via holes, as indicated in the via hole arrangement, shown in FIG. 4D, connect the buses of FIG. 4E to buses running in the Y direction in the second level of metallization, shown in FIG. 4C. In FIG. 4D, the via holes designated $V_{cc}$ respectively communicate between buses 101 and 102 in the top layer of metallization and $V_{cc}$ buses 23 in the second level of metallization. The $V_{bb}$ buses 103 and 104 in the top level of metallization communicate through via holes, some of which have been designated as $V_{bb}$ in FIG. 4D, to Y direction-running bus bars 24 in the second level of metallization for the distribution of the $V_{bb}$ supply. Finally, $V_{ee}$ bus 105 in the top level of metallization communicates through the via holes, designated $V_{ee}$ in FIG. 4D, with $V_{ee}$ bus bars 25 in the second level of metallization. As has been previously noted, the $V_{cc}$ represents the collector voltage supply in the previously described circuit cells and $V_{bb}$ represents the emitter supply. In a limited number of cells which serve an off-chip driving function, the $V_{ee}$ supply is used in place of the $V_{bb}$ supply as the emitter supply.

The $V_{cc}$ voltage bus bars 23 of FIG. 4C are connected to the X direction-running $V_{cc}$ bus bars 18 in the first level of metallization through a plurality of via holes from the via hold layout shown in FIG. 4B. For convenience in illustration, only a few of the $V_{cc}$ via holes are designated in FIG. 4B. Similarly, the Y oriented $V_{bb}$ bus bars 24 in the second level of metallization, FIG. 4C, are joined to the first level of metallization through a plurality of paired via holes through the intermediate layer of insulative material. Some of these $V_{bb}$ via holes are indicated in FIG. 4B. These via holes each contact an intracircuit metallization segment 93 to provide the $V_{bb}$ supply to the emitter of transistors T2 in each of the circuit cells. Metallization segments 93 may be more readily observed with reference to FIGS. 2A and 3. In addition, the $V_{bb}$ via holes also coincide with pairs of pads 106 in non-intracircuit region in the first metallization level of FIG. 4A.

The $V_{ee}$ supply is connected from bars 25 in the second level of metallization through the intermediate insulative layer by via holes, some of which have been designated as $V_{ee}$ in FIG. 4B. These via holes are joined to $V_{ee}$ supply nodes 107 in the first level metallization pattern of FIG. 4A.

Figure 6:
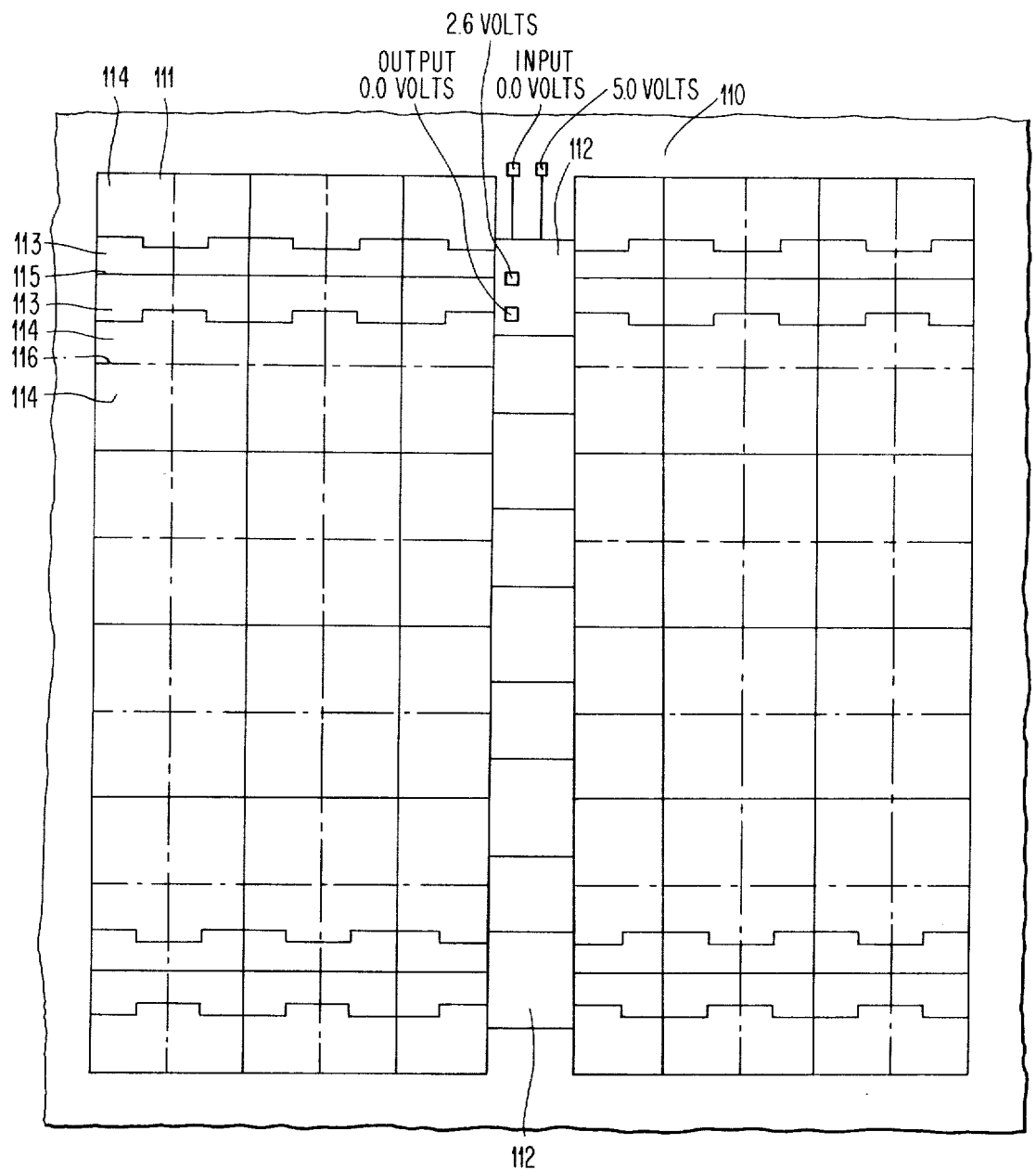
FIG. 6 is a diagrammatic plan view similar to the view of FIG. 1 of the layout of a chip to illustrate another embodiment of the present invention.
Figure 10:
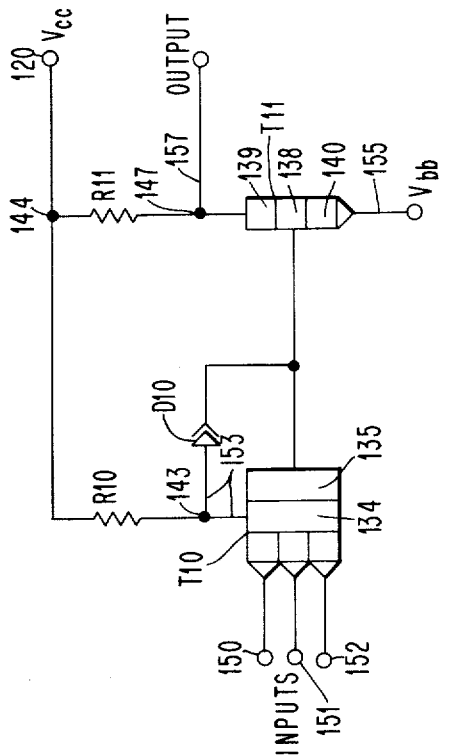
FIG. 10 is a schematic circuit diagram of the selected type of logic circuit formed in each of the cells of the integrated circuit array of FIG. 6.

In FIGS. 6–9 and 10, another embodiment of the present invention is shown in a manner similar to the illustration of the first embodiment. With reference to FIG. 6, diagrammatic plan view of the second embodiment is similar to that of FIG. 1 for the first embodiment. An integrated circuit chip 110 has an array of cells 111; each cell is in a row in the X orthogonal direction and a row in the Y orthogonal direction. Each cell 111 contains a sufficient number of transistors and resistors which, when interconnected by the intracell metallization, will form a selected type of circuit. In the present embodiment, the selective logic circuit, a schematic of which is shown in FIG. 10, is a T²L Schottky barrier diode clamped circuit similar to that of the first embodiment. The array further contains a row of voltage bias driver cells 112, each of which serves the function of receiving from off-chip supplies a pair of voltages having a 5 volt differential and reducing this differential to the operating voltage drop across the cells which is 1.8 volts. These driver cell circuits may be any conventional circuit for achieving this result.

Figure 8:
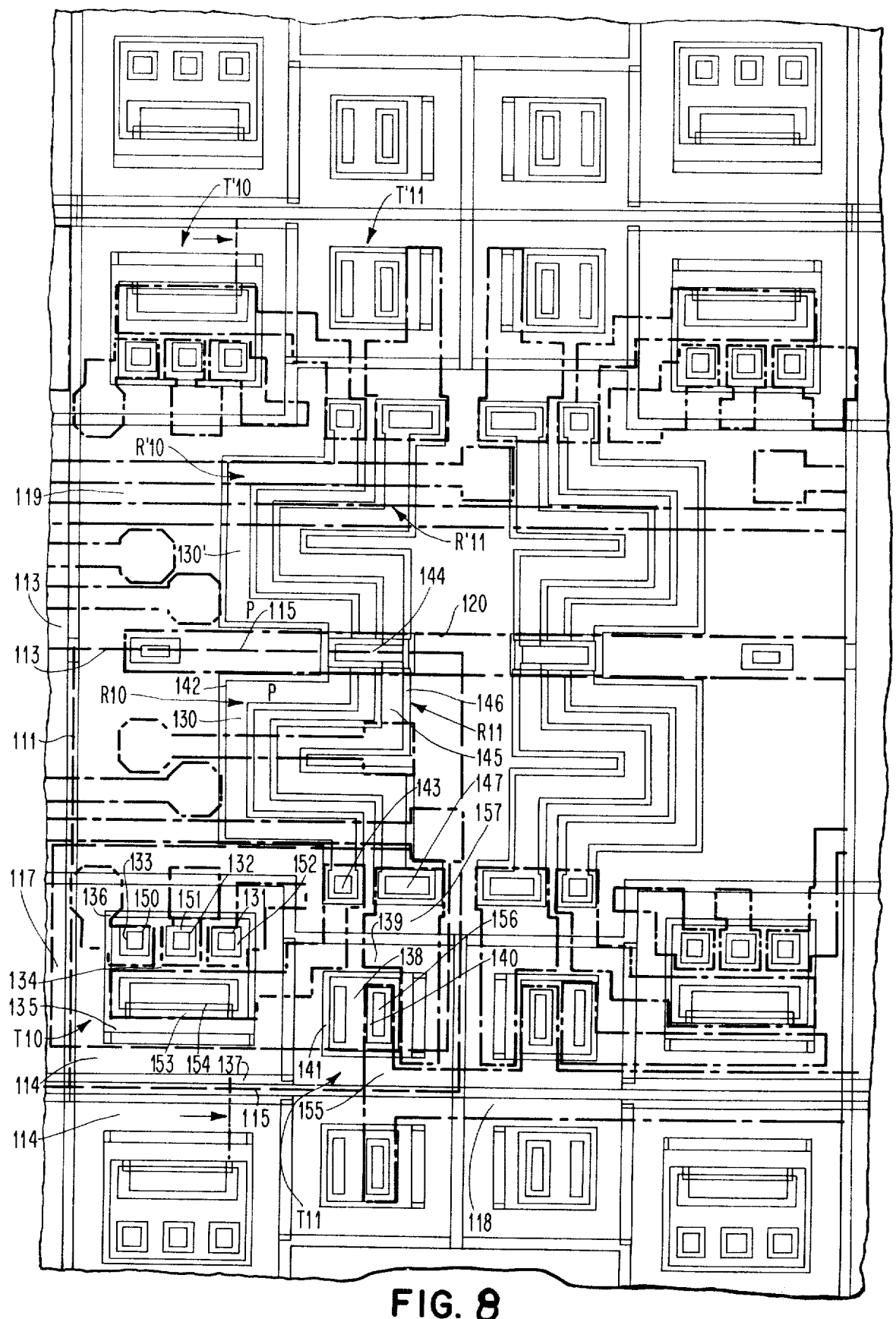
FIG. 8 is an enlarged plan view of a group of circuit cells of the chip of FIG. 6 with the first level of metallization shown thereon in phanton lines.

With respect to FIGS. 6 and 8, it should be noted that in the array, each of the cells 111 does not have a symmetrical layout; similar to the array in the first embodiment, each cell has a first layout configuration 113 on one side of the cell and a second layout configuration 114 on the opposite side of the cell. The rows in the X direction shown are arranged so that layout configurations 113 face each other at abutting row interfaces 115 and layout configurations 114 face each other at abutting row interfaces 116. It should be noted that in FIG. 8, which will be described in greater detail later in the specification, a cell 111 is shown enclosed within dotted lines, to be distinguished from the phantom lines which show a portion of the metallization in the same Figure.

Figure 7A:
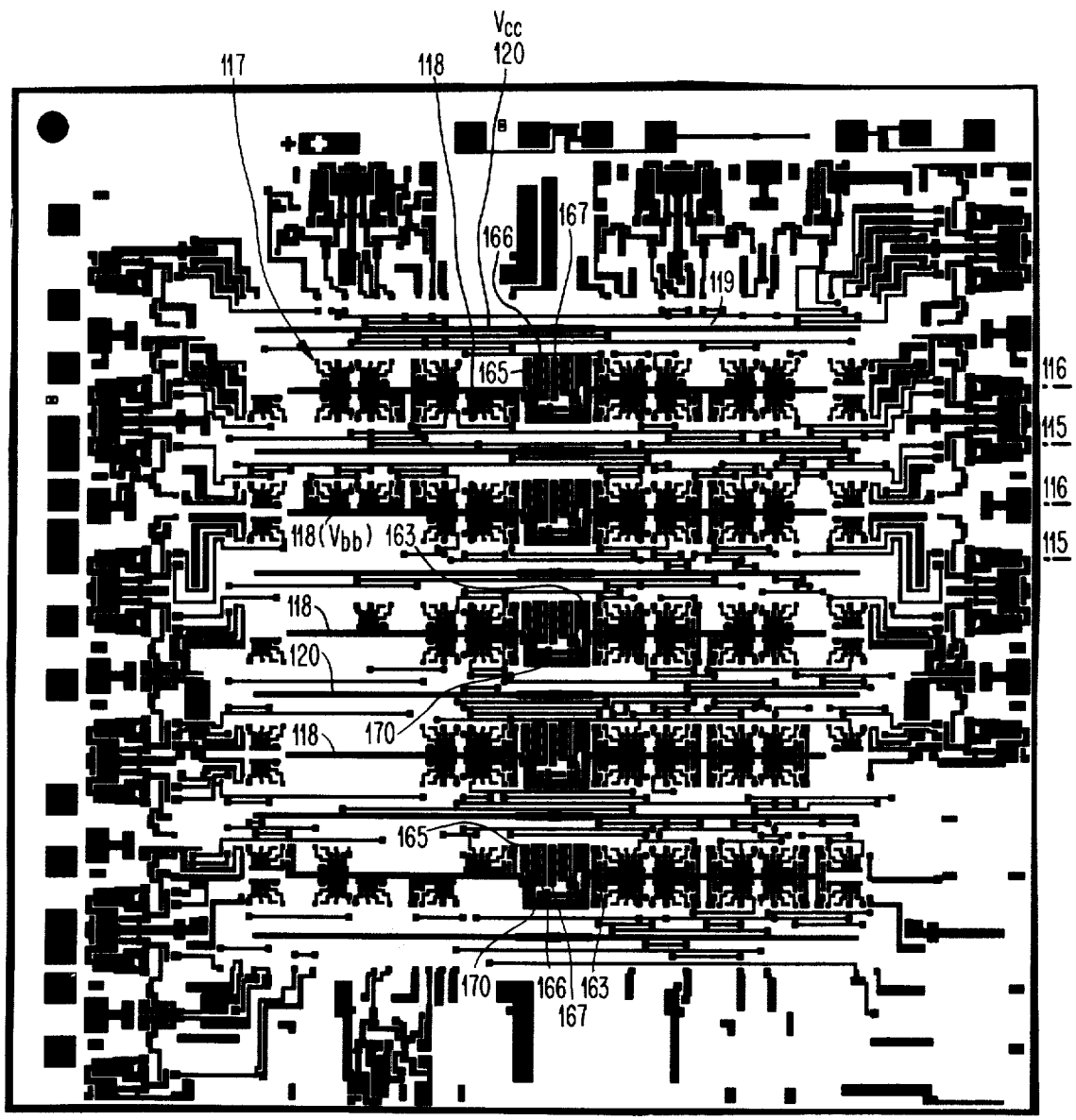
FIG. 7A is a plan view of a mask for the first layer of metallization above the chip of FIG. 6.
Figure 7B:
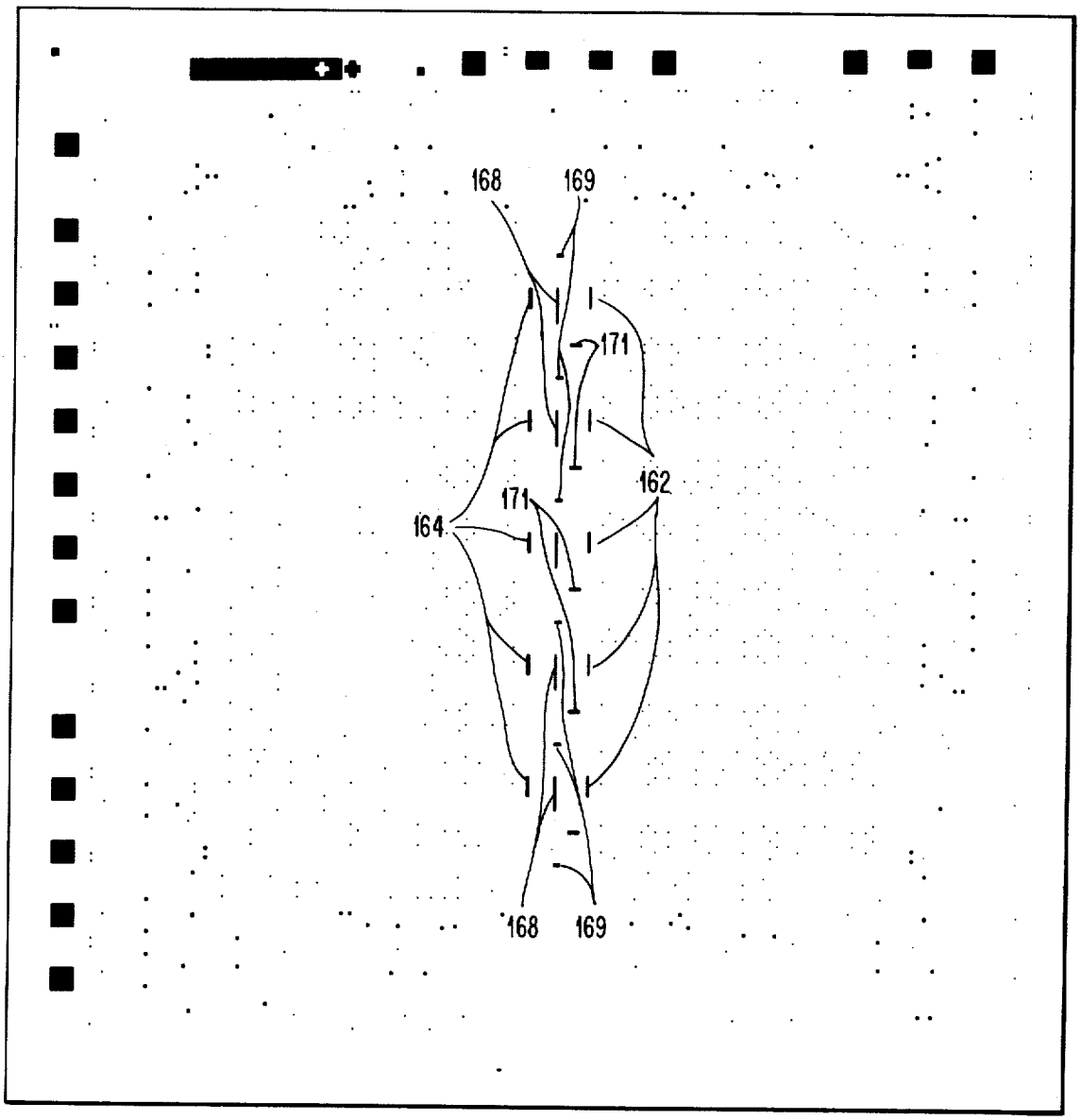
FIG. 7B is a plan view of a mask for via holes connecting the metallization formed by the mask of FIG. 7A to the metallization formed by the mask of FIG. 7C.

The layout of the first level of metallization will be more clearly understood with reference to FIG. 7A which is the mask for producing the first level metallization. The dark areas in the layout of FIG. 7A represent metallization. The metallization layout corresponds to the cell layout of FIG. 6. As an aid in orientation, some of interfaces 115 and 116 are shown in FIG. 7A in phantom lines. The horizontal metallization which provides the voltage level distribution and the interconnections between cells is represented by the relatively long lines running in the X direction, while the metallization for intracell connections is shown in clusters, for example, cluster 117 represents intracell metallization for a single cell. A more detailed view of the intracell metallization as well as some of the intercell metallization may be had with reference to FIG. 8 wherein a portion of a first level of metallization is shown superimposed upon the cell layout in phantom lines. Here too, the intracell metallization for a single cell is shown encircled and designated 117.

With reference to FIG. 7A, the horizontal lines of metallization are also arranged in sets or groups so as to run above interfaces 115 and 116 in the horizontal direction. Each of the cells comprises a pair of resistors, R10 and R11, and a pair of transistors, T10 and T11. Resistors R10 and R11 constitute cell side layout configuration 113 and abut interface 115, while transistors T10 and T11 constitute cell side layout configuration 114 and abut interface 116. A single horizontal bus bar 118, which is utilized for the $V_{bb}$ voltage distribution to the cells in rows along interface 116, constitutes the line set above interface 116. On the other hand, at interfaces 115, the wiring channels at the first metallization level shown in FIG. 7A are wider and the sets of horizontal lines 119 having up to ten lines each running above resistors R10 and R11 are utilized to provide substantially all of the interconnections between cells in rows in the X direction, as well as bus bar 120 for the $V_{cc}$ voltage supply distribution to the cells. Thus, in the first metallization level layout of FIG. 7A, lines running in the X direction in sets 118 and 119 provide for all of the intracell connections in the X direction as well as both the $V_{cc}$ and $V_{bb}$ voltage supplies, the only two voltage supplies which each of the cells needs in order to operate.

Similar to the first embodiment of the present invention, the second embodiment being described with respect to FIGS. 6 and 7A has the cells oriented in their respective rows in the Y direction so that each cell has one layout configuration on one side of the cell and an opposite layout configuration on the opposite side of the cell. Likewise, the rows in the Y direction are arranged with the cells in alternative orientation so that sides of cells having said one layout configuration face each other and sides of cells having the opposite layout configuration also face each other at alternate row interfaces.

Figure 7C:
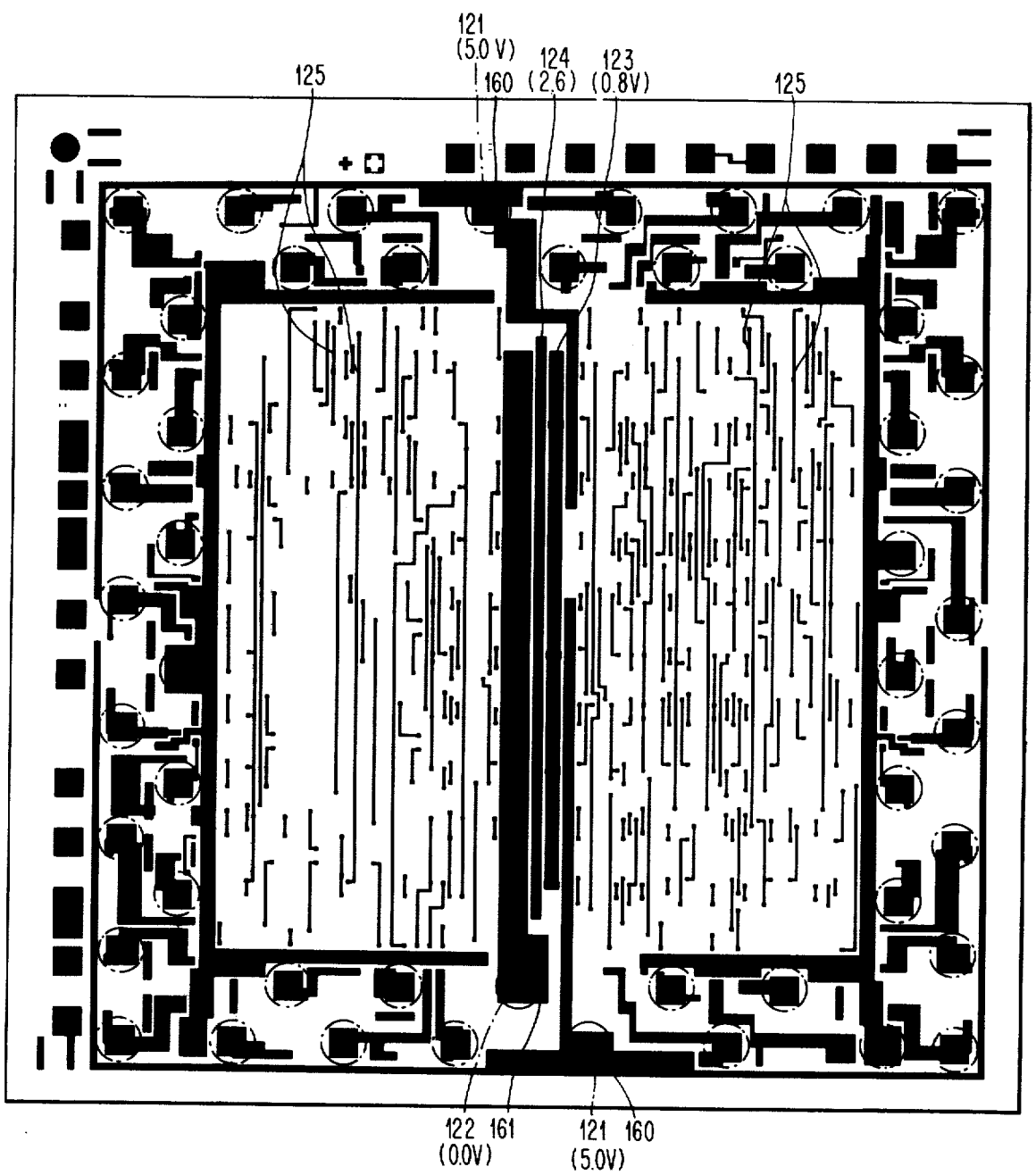
FIG. 7C is a plan view of a mask for the second layer of metallization for the chip of FIG. 6.

Referring now to the second level of metallization shown in the mask of FIG. 7C, the dark areas represent the metallization lines. The second level metallization pattern is selectively connected to the first level metallization pattern, shown in FIG. 7A, through a plurality of via holes, shown in the mask of FIG. 7B. In the second metallization level of FIG. 7C, the voltage distribution bus bar 121 (5 volts) provides one of the inputs to voltage bias driver circuit cells 112, FIG. 6, while bus bars 122 (0 volts) provide the other input to these bias cells. On the other hand, bus bar 123 receives the 0.8 output from bias driver cells 112, and act to provide for uniform distribution of this 0.8 volt output to all of the operating cells 111 in the manner which will be described in greater detail later in the specification. Bus bar 124 is connected to the 2.6 volt output of bias driver cells 112 and functions in the distribution of this 2.6 volt output in a manner which will be subsequently described. In addition, the second level of metallization, FIG. 7C, includes a plurality of parallel interconnection lines 125, running in the Y direction, for providing the interconnection between rows of circuit cells in the Y direction. In addition, lines 125 perform the function previously described with respect to the second level metallization pattern in FIG. 4C of providing cross-overs over one or more lines in a given set 119 in the first metallization pattern shown in FIG. 7A.

Figure 8A:
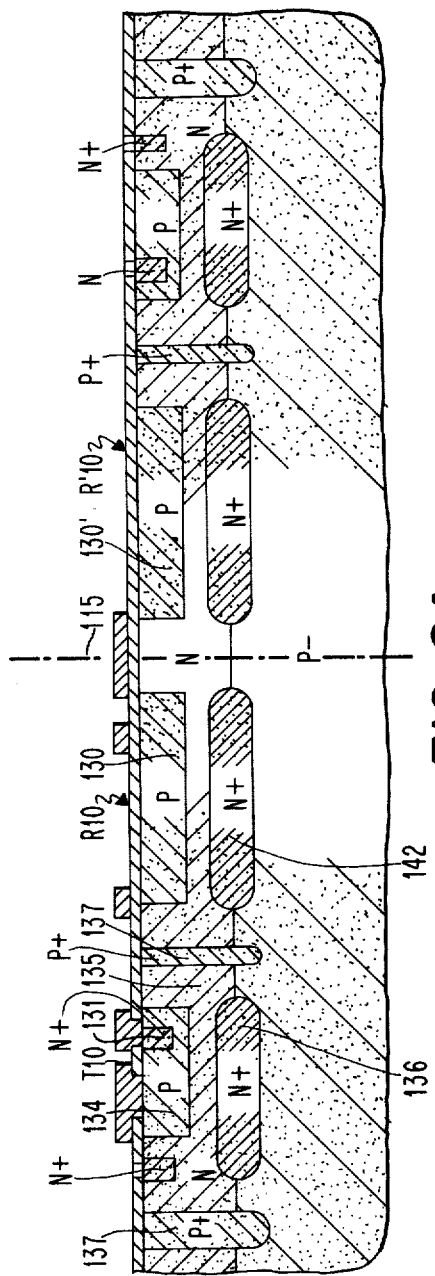
FIG. 8A is a diagrammatic cross-sectional view taken along line 8A—8A of FIG. 8.

With reference to FIGS. 8 and 8A, structural layout of the cells will now be described. As previously mentioned, each of the cells comprises a pair of transistors, T10 and T11, and a pair of resistors, R10 and R11. The cells abut each other at interfaces with resistors R10 comprising a P region 130 which is, in effect, continuous with a similar region 130' in resistor R'10 of the abutting circuit cell along interface 115. Transistor T10 is a three-emitter transistor with N+ regions 131, 132 and 133 serving as emitters. Transistor T10 further includes base region 134, collector region 135, and N+ subcollector region 136. The structure is surrounded by P+ isolation 137.

Transistor T11 comprises P type base region 138, N type collector region 139, N+ emitter region 140, all formed over N+ subcollector region 141. Resistor R10, in addition to P region 130 which serves the function of the resistor proper, comprises N+ region 142. A first contact opening 143 is made to resistor R10 through the layer of insulative material separating the chip surface from the first level of metallization; the other contact opening 144 is connected to $V_{cc}$ bus 120 in the first level of metallization. Likewise, resistor R11 comprises P region 145 formed over N+ region 146 with a contact opening 147. Contact 144 is common to resistor R11 and serves as the other contact.

The steps in the formation of the structure of the second embodiment of the present invention, as shown in FIGS. 8 and 8A, will not be described as they are well known in the art. In fact, the vertical structure is almost the same as that described in U.S. Pat. No. 3,539,876 and, consequently, the techniques of said patent are very suitable for the fabrication of the structure of this embodiment. The basic unit cells which have been described in detail each having a circuit structure, shown in schematic view in FIG. 10. The circuits which are $T^2L$ circuits with a multiple (three) emitter transistor T10 coupled to a single emitter transistor T11 are very similar in circuit operation to the circuits of the first embodiment of the present invention, as shown in FIG. 9. The base 134 of transistor T10 is clamped to the collector 135 by Schottky barrier diode D10. Resistors R10 and R11 correspond to resistors similarly designated in the structures of FIGS. 8 and 8A. Input terminals 150, 151 and 152 in FIG. 10 are represented by metallization segments similarly designated in FIG. 8. Diode D10 is formed by metallization segment 153 in FIG. 8 which, through contact opening 154, shorts P base region 135 to collector region 135 in transistor T10. Diode D10 is connected to resistor R10 through metallization segment 153 which runs to contact opening 143. As previously mentioned, the $V_{cc}$ supply is coupled from bus bar 120 to resistors R10 and R11 to contact 144. Also with respect to FIGS. 8 and 10, the $V_{bb}$ supply to emitter 140 of transistor T11 is connected from bus 118 by metallic interconnector 155 through contact opening 156 to emitter 140. The output from the cell is taken off connector 157.

As has been previously mentioned with respect to FIG. 8, the other cell in the pair is the mirror image of the cell circuit just described with respect to interface 115 above which $V_{cc}$ bus 120 lies. For purposes of orientation, the transistors and resistors in the mirror image of the pair have been designated as T'10, T'11, R'10 and R'11. It should be noted that the effective portions of the resistors, e.g., P regions 130 and 130', are continuous between the R and R' resistors with respect to the voltage provided from $V_{cc}$ bus bar 120 through a center contact, e.g., contact 144, serving to separate the resistors into the halves which are R and R'.

The voltage distribution throughout the ship will now be described with respect to FIGS. 7A, 7B and 7C, and FIG. 8, if necessary for some additional detail. Referring now to FIG. 7C, the structure comprises a plurality of peripheral pads, shown as squares or partial squares around the periphery, communicating with a plurality of circular terminal pads, shown in phantom lines, disposed on a layer of insulative material, not shown, and communicating through the layer of insulative material to the pads in the second level of metallization.

From off-chip, a voltage level of 5 volts is applied to bus bars 121 through terminal pads 160; also, a voltage level of ground or zero volts is applied to bus bar 122 through pad 161. Bus bars 121 and 122 are connected to and serve as the input to bias driver cells 112 as follows. Bus bars 121 are connected through via holes 162, FIG. 7B, through the layer of insulative materials separating the two layers of metallization to metallization segments 163 in the bias driver intracell metallurgy shown in FIG. 7A. Likewise, bus bar 122 in the second level of metallurgy is connected through via holes 164 to metallic segments 165 in the bias driver intracell metallurgy, FIG. 7A.

In turn, the outputs from the bias driver cells are $V_{bb}$ (0.8 volts) taken from metallic terminal segments 166 and $V_{cc}$ (2.6 volts) taken from bias driver metallurgy segment 167, FIG. 7A.

The $V_{bb}$ output terminals from the bias drivers are connected to $V_{bb}$ bus bars 118 on the first metallization level. The $V_{cc}$ terminals 167 (2.6 volts) in the bias driver circuitry are connected through via holes 168 through the intermediate insulative layer to bus bar 124 in the second level of metallization, FIG. 7; then through via holes 169 back down through the intermediate insulative layer from bus bar 124 to bus bars 120 running over interfaces 115 in the first metallization layer which serves as the $V_{cc}$ distribution among the rows of cells in the X direction.

It should also be noted that in addition to being connected to the $V_{bb}$ bus bars 118, bias driver terminals 166 are also connected through metallization segments 170 on the first metallization layer to via holes 171 through the intermediate layer of insulative material to bus bar 123 in the second level of metallization which serves to short together the $V_{bb}$ output of the bias driver circuits in each of the rows in the X direction in order to insure a uniform $V_{bb}$ level in all cells throughout the chip.

While only two embodiments have been extensively described in order to illustrate the present invention, it should be clear to one skilled in the art that the principles of the present invention may be practiced in a wide variety of embodiments combining various of the structural expedients illustrated with respect to the first and second embodiments. For example, the respective circuit cells may abut each other on one or more or all of their four sides or they may be completely spaced from each other. In combination with such a cell arrangement, any pad array, either internally disposed with respect to the chip perimeter or disposed around the chip perimeter, may be utilized.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a planar semiconductor integrated circuit chip structure comprising a surface from which a plurality of regions of different conductivity types extended into the chip to provide transistors and resistors, the improvement wherein said transistors and resistors are arranged into a plurality of repetitive cells, each of said cells containing a sufficient number of transistors and resistors to form a selected type of logic circuit and said cells being arranged in an orthogonal array with the cells in substantially parallel rows in both orthogonal directions, and wherein the structure includes a level of metallization disposed above and insulated from said array by at least one layer of electrically insulative material, said level of metallization comprising a plurality of groups of substantially parallel lines respectively disposed above and running parallel to a corresponding plurality of interfaces between rows of said cells in one of said orthogonal directions, said group of lines being connected to a plurality of cells abutting the interface below said group to provide interconnections between and voltage level supplies to said cells, and line patterns respectively disposed spaced from and between said groups and above said cells to provide intracell connections.

2. The structure of claim 1 wherein said rows of cells are spaced from each other at said interfaces to provide channels substantially free of transistors or resistors at said interfaces.

3. The structure of claim 2 wherein said rows of cells in the other of said orthogonal directions are also spaced from each other.

4. The structure of claim 1 wherein each of a plurality of the cells in each of said rows in said one orthogonal direction has a first cell layout configuration at one side and a second layout configuration at its opposite side, and said rows of cells in said one orthogonal direction are arranged alternatively so that said sides of cells with said first configuration face sides of cells in interfacing rows with said first configuration and sides of cells with said second configuration face sides of cells in interfacing rows with said second configuration.

5. The structure of claim 4 wherein said facing cell sides of said first configuration are mirror images of each other and said facing cell sides of said second configuration are mirror images of each other.

6. The structure of claim 4 wherein connections from lines over each of said interfaces are respectively made to each side of pairs of facing cell sides at the interface.

7. The structure of claim 5 wherein connections from lines over each of said interfaces are respectively made to each of pairs of facing cell sides at the interface.

8. The structure of claim 6 wherein said lines from which said connections are made are bus bars providing voltage level supplies.

9. The structure of claim 7 wherein said lines from which said connections are made are bus bars providing voltage level supplies.

10. The structure of claim 6 wherein each side of a pair of said facing cell sides has corresponding input-output nodes adapted to receive said connections from lines over said interfaces.

11. The structure of claim 7 wherein each side of a pair of said facing cell sides has corresponding input-output nodes adapted to receive said connections from lines over said interfaces.

12. The structure of claim 1 wherein the lines running parallel to said interfaces provide interconnections between cells respectively arranged in rows in said one orthogonal direction, and wherein said structure includes an additional level of metallization separated from said original level of metallization by at least one layer of electrically insulative material and comprising lines running in the second of said orthogonal directions to provide interconnections between cells in rows in said second orthogonal direction.

13. The structure of claim 12 wherein said additional level of metallization further includes a plurality of voltage level bus bars respectively disposed above the interfaces between rows of said cells in said second orthogonal direction, each of said bus bars connected to a plurality of cells abutting the interface below said bus bar.

14. The structure of claim 12 wherein said additional level of metallization also provides cross-over lines for connecting lines within a respective group of lines which are separated from each other by other lines in said group.

15. In the method for forming a planar semiconductor integrated circuit chip structure comprising a surface from which a plurality of regions of different conductivity types extended into the chip to provide transistors and resistors, the improvement comprising forming said transistors and resistors into a plurality of repetitive cells, each of said cells containing a sufficient number of transistors and resistors to form a selected type of logic circuit, forming said cells in an orthogonal array with the cells in substantially parallel rows in both orthogonal directions, and forming the transistors and resistors in each of a plurality of said cells in each of said rows in one of said orthogonal directions so that each of said cells has a first cell layout configuration at one side and a second layout configuration at its opposite side, and arranging said rows of cells in said one orthogonal direction alternatively so that said sides of cells with said first configuration face sides of cells in interfacing rows with said first configuration and sides of cells with said second configuration face sides of cells in interfacing rows with said second configuration, and forming above said array and insulated therefrom by at least one layer of electrically insulative material, a level of metallization comprising a plurality of groups of substantially parallel lines respectively disposed above and running parallel to a corresponding plurality of interfaces between rows of said cells in one of said orthogonal directions, each group of lines being connected to a plurality of cells abutting the interface below said group to provide interconnections between and voltage level supplies to said cells, and line patterns respectively disposed spaced from and between said groups and above said cells to provide intracell connections.

16. The method of claim 15 wherein said facing cell sides of said first configuration are mirror images of each other and said facing cell sides of said second configuration are mirror images of each other.

17. The method of claim 16 wherein connections from lines over each of said interfaces are respectively made to each side of pairs of facing cell sides at the interface.

18. The method of claim 17 wherein connections from lines over each of said interfaces are respectively made to each of pairs of facing cell sides at the interface.

19. The method of claim 17 wherein said lines from which said connections are made are bus bars providing voltage level supplies.

20. The method of claim 18 wherein said lines from which said connections are made are bus bars providing voltage level supplies.

21. The method of claim 17 wherein each side of a pair of said facing cell sides has corresponding input-output nodes adapted to receive said connections from lines over said interfaces.

22. The method of claim 18 wherein each side of a pair of said facing cell sides has corresponding input-output nodes adapted to receive said connections from lines over said interfaces.

23. The method of claim 15 wherein the lines running parallel to said interfaces provide interconnections between cells respectively arranged in rows in said one orthogonal direction, and including the further steps of forming at least one layer of electrically insulative material over said level of metallization, and forming an additional level of metallization over said electrically insulative material comprising lines running in the second of said orthogonal directions to provide interconnections between cells in rows in said second orthogonal direction.

24. The method of claim 23 wherein said additional level of metallization further includes a plurality of voltage level bus bars respectively disposed above the interfaces between rows of said cells in said second orthogonal direction, each of said bus bars connected to a plurality of cells abutting the interface below said bus bar.

25. The method of claim 24 wherein said additional level of metallization also provides cross-over lines for connecting lines within a respective group of lines which are separated from each other by other lines in said group.

* * * * *

UNITED STATES PATENT AND TRADEMARK OFFICE
CERTIFICATE OF CORRECTION

PATENT NO. : 3,999,214
DATED : December 21, 1976
INVENTOR(S) : Eugene E. Cass

It is certified that error appears in the above-identified patent and that said Letters Patent are hereby corrected as shown below:

Column 6, Line 65      "$V_{33}$" should be -- $V_{ee}$ --

Column 13, Line 53     "135" should be -- 134 --

Column 14, Line 9      "ship" should be -- chip --

Column 15, Line 27     "said" should be -- each --

Signed and Sealed this

Eighteenth Day of April 1978

[SEAL]

Attest:

RUTH C. MASON
Attesting Officer

LUTRELLE F. PARKER
Acting Commissioner of Patents and Trademarks